(12) United States Patent
Fu et al.

(10) Patent No.: US 11,309,222 B2
(45) Date of Patent: Apr. 19, 2022

(54) SEMICONDUCTOR CHIP WITH SOLDER CAP PROBE TEST PADS

(71) Applicant: ADVANCED MICRO DEVICES, INC., Santa Clara, CA (US)

(72) Inventors: Lei Fu, Austin, TX (US); Milind S. Bhagavat, Los Altos, CA (US); Chia-Hao Cheng, Hsinchu (TW)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/556,105

(22) Filed: Aug. 29, 2019

(65) Prior Publication Data
US 2021/0066144 A1 Mar. 4, 2021

(51) Int. Cl.
*H01L 21/66* (2006.01)
*H01L 21/768* (2006.01)
*H01L 23/00* (2006.01)

(52) U.S. Cl.
CPC ........ *H01L 22/32* (2013.01); *H01L 21/76871* (2013.01); *H01L 24/11* (2013.01); *H01L 24/14* (2013.01); *H01L 24/17* (2013.01); *H01L 2224/0401* (2013.01); *H01L 2224/1191* (2013.01); *H01L 2224/11462* (2013.01); *H01L 2224/11849* (2013.01)

(58) Field of Classification Search
CPC ... H01L 22/32; H01L 21/76871–76873; H01L 24/14; H01L 24/06; H01L 24/11; H01L 2224/0391; H01L 2224/0401; H01L 2224/06515; H01L 2224/11462; H01L 2224/11849; H01L 2224/14515; H01L 2224/81052; H01L 2021/60217; H01L 2225/06596
See application file for complete search history.

(56) References Cited

U.S. PATENT DOCUMENTS

| | | | | |
|---|---|---|---|---|
| 5,726,502 A | * | 3/1998 | Beddingfield | H01L 23/544 257/797 |
| 6,008,061 A | * | 12/1999 | Kasai | G01R 31/2884 257/E21.508 |
| 7,105,917 B2 | * | 9/2006 | Cho | H01L 23/5258 257/678 |
| 2005/0121804 A1 | * | 6/2005 | Kuo | H01L 24/05 257/781 |
| 2005/0248011 A1 | * | 11/2005 | Jung | H01L 24/05 257/678 |
| 2006/0164110 A1 | * | 7/2006 | Miyazaki | G01R 3/00 324/754.03 |

(Continued)

FOREIGN PATENT DOCUMENTS

| | | | | | |
|---|---|---|---|---|---|
| CN | 1402304 A | * | 3/2003 | | H01L 22/20 |
| CN | 101051617 A | * | 10/2007 | | H01L 24/11 |

(Continued)

*Primary Examiner* — Errol V Fernandes
*Assistant Examiner* — Jeremy J Joy

(57) ABSTRACT

Various semiconductor chips with solder capped probe test pads are disclosed. In accordance with one aspect of the present invention, a semiconductor chip is provided that includes a substrate, plural input/output (I/O) structures on the substrate and plural test pads on the substrate. Each of the test pads includes a first conductor pad and a first solder cap on the first conductor pad.

20 Claims, 20 Drawing Sheets

(56) References Cited

U.S. PATENT DOCUMENTS

| | | | | |
|---|---|---|---|---|
| 2006/0172444 A1* | 8/2006 | Jungnickel | | H01L 24/12 |
| | | | | 438/14 |
| 2008/0224326 A1* | 9/2008 | Kuo | | H01L 24/05 |
| | | | | 257/780 |
| 2009/0166861 A1* | 7/2009 | Lehr | | H01L 24/85 |
| | | | | 257/737 |
| 2010/0148812 A1* | 6/2010 | Nagai | | H01L 24/14 |
| | | | | 324/762.06 |
| 2012/0206160 A1* | 8/2012 | Wu | | H01L 24/06 |
| | | | | 324/756.07 |
| 2012/0261662 A1* | 10/2012 | Liang | | H01L 25/0657 |
| | | | | 257/48 |
| 2012/0326146 A1 | 12/2012 | Hui et al. | | |
| 2013/0106459 A1 | 5/2013 | Tseng et al. | | |
| 2013/0119382 A1* | 5/2013 | Kao | | H01L 22/32 |
| | | | | 257/48 |
| 2013/0147032 A1* | 6/2013 | Jeng | | H01L 21/76885 |
| | | | | 257/737 |
| 2013/0233601 A1* | 9/2013 | Kao | | H01L 22/32 |
| | | | | 174/257 |
| 2015/0287654 A1* | 10/2015 | Uehling | | H01L 24/14 |
| | | | | 257/48 |
| 2016/0276235 A1* | 9/2016 | Chen | | H01L 22/32 |
| 2017/0186715 A1* | 6/2017 | Yu | | H01L 24/03 |
| 2018/0151453 A1* | 5/2018 | Yu | | H01L 24/11 |
| 2018/0315672 A1 | 11/2018 | Cassier et al. | | |
| 2020/0243405 A1* | 7/2020 | Kim | | H01L 24/48 |
| 2020/0350221 A1* | 11/2020 | Liu | | H01L 22/32 |

FOREIGN PATENT DOCUMENTS

| | | | | | |
|---|---|---|---|---|---|
| KR | | 20050106581 A | * | 11/2005 | ............. H01L 22/32 |
| WO | | WO-2010064341 A1 | * | 6/2010 | ............. H01L 24/06 |

\* cited by examiner

SEMICONDUCTOR CHIP WITH SOLDER CAP PROBE TEST PADS

BACKGROUND OF THE INVENTION

Current integrated circuits routinely include many tens or even hundreds of millions of transistors and other circuit devices configured in arrangements of staggering complexity. Not surprisingly, testing of integrated circuits is vital to ensure that both the huge numbers of circuit devices and the myriad of manufacturing steps required to make those devices meet or exceed design specifications. One type of electrical test routinely performed on integrated circuits is performed at the wafer level and involves establishing ohmic contact with certain areas of an integrated circuit using a special instrument known as a probe system. After ohmic contact is established, the tester of the probe system electrically stimulates the integrated circuit in a variety of ways to test various functionalities thereof. Another type of testing for chips destined for packages is performed after the individual chips are diced from the wafer and mounted into packages.

A conventional probe system consists of a prober, which is an instrument designed to hold a semiconductor wafer and step it to various positions so that the individual dice thereof can be brought into selected contact with a tester, which is another instrument that typically performs the actual electrical stimulation of the individual dice. In one conventional set up, a probe card is mounted to the prober and used to establish the ohmic contact with the semiconductor wafer. The probe card consists of a stack of a printed circuit board, a semiconductor chip package substrate, and a probe head. The printed circuit board holds the probe substrate and is configured to perform a relatively low-speed testing on the integrated circuits of the semiconductor wafer. The probe substrate is similar in design to a semiconductor chip package substrate. The probe substrate typically includes a collection of conductor pins that project away from the substrate and are used to establish the ohmic contact with areas on the semiconductor dice of the wafer.

One conventional variant of a probe substrate includes an array of pins that are capable of contacting not only peripheral areas of an integrated circuit but also internal areas, such as solder bumps in the case of a flip-chip type integrated circuit. Another conventional variant of a probe substrate includes two or more collections of conductor pins that are typically configured to contact peripheral, but not internal areas of an integrated circuit. The conventional single array probe substrate is limited to probing a single semiconductor die at a time. The conventional dual site probe substrate is capable of multi-site probing, but only for peripheral areas of an integrated circuit.

BRIEF DESCRIPTION OF THE DRAWINGS

The foregoing and other advantages of the invention will become apparent upon reading the following detailed description and upon reference to the drawings in which.

DETAILED DESCRIPTION

In many current integrated circuit designs, the pitch or lateral spacing between input/output (I/O) structures such as micro bumps, is so small that it is impractical to probe test such chips by directly contacting the I/O structures with probe pins. As a work around, many conventional semiconductor chips that utilize small pitch micro bumps are fabricated with aluminum sacrificial test pads that are positioned around the periphery of the I/O structures. These sacrificial test pads are accessed by way of openings that are formed in an overlying passivation layer. Typically, a probe card with large numbers of very sharp tipped probe pins are brought into contact with various of the aluminum test pads. Sharp tips are required because the aluminum pads tend to almost immediately form a native oxide film that which is brittle and must be fractured by impact loading of the sharpened probe pins in order to establish proper ohmic contact with the underlying aluminum pads. This produces significant wear on the sharpened tips and if there are misalignments between the position of the probe pins and the underlying aluminum pads, the surrounding passivation layer can be potentially damaged by the sharpened tips.

The disclosed arrangements utilize a different type of test pad structure, one that includes an underlying conductor pad, possibly a plating seed layer and an outermost solder cap. The usage of a solder cap equipped test pad has several beneficial aspects. These benefits and other features will be described in detail below.

In accordance with one aspect of the present invention, a semiconductor chip is provided that includes a substrate, plural input/output (I/O) structures on the substrate and plural test pads on the substrate. Each of the test pads includes a first conductor pad and a first solder cap on the first conductor pad.

In accordance with another aspect of the present invention, a method of manufacturing a semiconductor chip that has a substrate is provided. The method includes fabricating plural input/output (I/O) structures on the substrate and fabricating plural test pads on the substrate. Each of the test pads includes a first conductor pad and a first solder cap on the first conductor pad.

In accordance with another aspect of the present invention, a method of testing a semiconductor chip is provided where the semiconductor chip has a substrate, plural first conductor pads on the substrate and plural test pads on the substrate each including a second conductor pad and a first solder cap on the second conductor pad. The method includes contacting one or more probe pins on one or more of the first solder caps, and probe testing the semiconductor chip.

Figure 1:
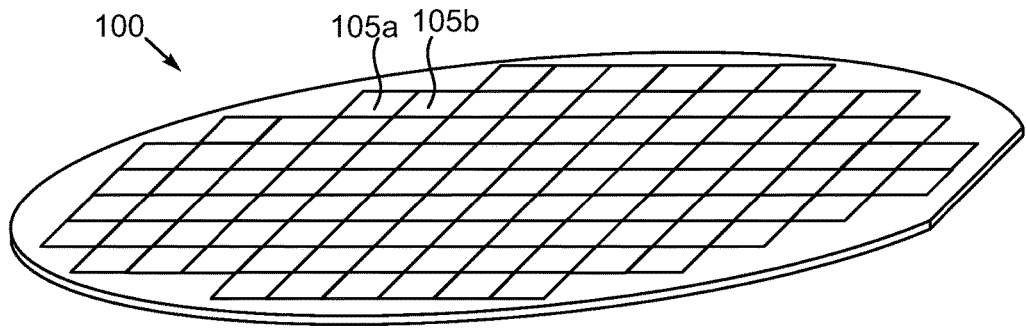
FIG. 1 is a pictorial view of an exemplary conventional semiconductor wafer.

In the drawings described below, reference numerals are generally repeated where identical elements appear in more than one figure. Turning now to the drawings, and in particular to FIG. 1, therein is depicted a pictorial view of an exemplary conventional semiconductor wafer 100 that includes plural unsingulated semiconductor chips, a couple of which are labeled 105a and 105b, respectively. Attention is now turned to FIG. 2, which is a sectional view of the semiconductor wafer 100 that encompasses the semiconductor chip 105a. Note that the lateral confines of the semiconductor chip 105a are delineated by the dashed lines 110a and 110b respectively. The semiconductor chip 105a includes a base substrate 115, a device region 120 formed thereon that includes multitudes of circuit elements, such as transistors, capacitors, resistors, metal traces and other types of logic elements. A metallization stack 125 is fabricated on the device region 120 and consists of plural metallization layers 126 and interlevel dielectric (ILD) layers 128. Only a few metallization layers 126 and ILD layers 128 are shown. It should be understood that many more than the two or three layers depicted in the metallization stack 125 are typically implemented in conventional semiconductor chip designs. An uppermost metallization layer of the metallization stack 125 includes plural conductive vias 130 that are positioned in a passivation layer 135. Another passivation layer 137 is fabricated on the passivation layer 135. The semiconductor chip 105a is designed to be singulated from the wafer 100 and flipped over from the orientation shown in FIG. 2 and mounted on and electrically connected to some other circuit board by way of plural microbumps, three of which are shown and labeled 140a, 140b and 140c, respectively. The chip 105a can actually include scores or even hundreds of such microbumps 140a, 140b and 140c. The microbumps 140a, 140b and 140c each consist of a pillar portion 145 fabricated on a seed layer 150 and topped by a nickel layer 155 formed on the pillar portion 145, a copper layer 160 formed on the nickel layer 155 and a solder cap 165 formed on the copper layer 155. The seed layer 150 is fabricated on and in electrical contact with an underlying aluminum bump pad 170a and the microbumps 140b and 140c are similarly fabricated on bump pads 170b and 170c. The bump pads 170a, 170b and 170c are part of an uppermost metallization layer of the stack 125.

The microbumps 140a, 140b and 140c are fabricated with as small a bump-to-bump pitch as possible in order to improve packing density and shorten electrical pathways. It is necessary to probe test the semiconductor chip 105a with a probe card 172 that includes multitudes of probe pins 174a and 174b and multitudes of others that are not visible. The bump-to-bump pitch and size of the microbumps 140a, 140b and 140c are typically so small that probing the microbumps 140a, 140b and 140c directly is impractical. To work around the probe pin access issue, the semiconductor chip 105a is fabricated with plural aluminum test pads, two of which are shown and labeled 177a and 177b, respectively. The test pads 177a and 177b are positioned near the metallization associated with the microbumps 140a, 140b and 140c. Access for probing to the pads 177a and 177b by way of the probe card 172 and pins 174a and 174b is provided by way of respective openings 181a and 181b in the passivation layer 137. Probe testing by way of the probe card 172 and pins 174a and 174b involves bringing the pointed probe pins 174a and 174b into forceful contact with the aluminum test pads 177a and 177b. A forceful engagement between the pins 174a and 174b and the pads 177a and 177b, respectively, is necessary because the aluminum pads 177a and 177b have a naturally occurring brittle aluminum oxide coating, which is not visible in FIG. 2 but which will be shown in subsequent figures. Engagement between the probe pin 174a and the underlying test pad 177a will be illustrated in FIGS. 3, 4 and 5 and used to describe some pit falls of the conventional probe pad arrangement depicted in FIG. 2.

Figure 2:
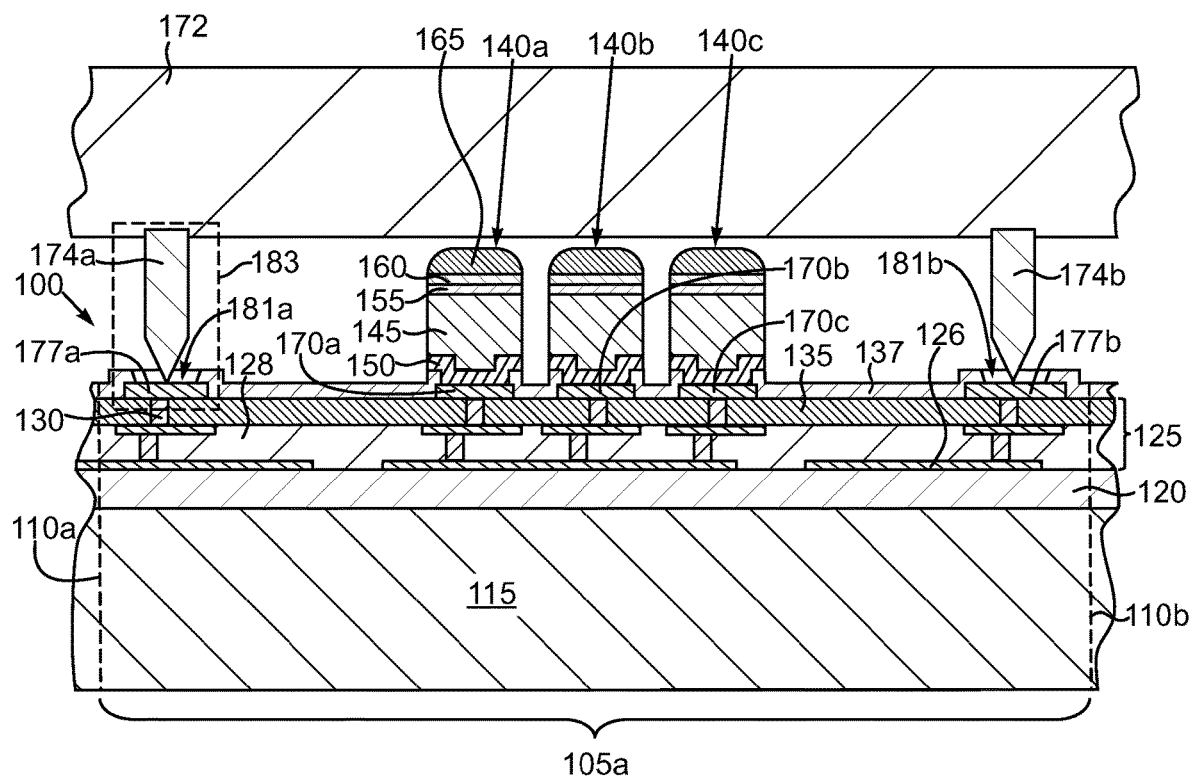
FIG. 2 is a sectional view of one portion of the wafer shown in FIG. 1.
Figure 3:
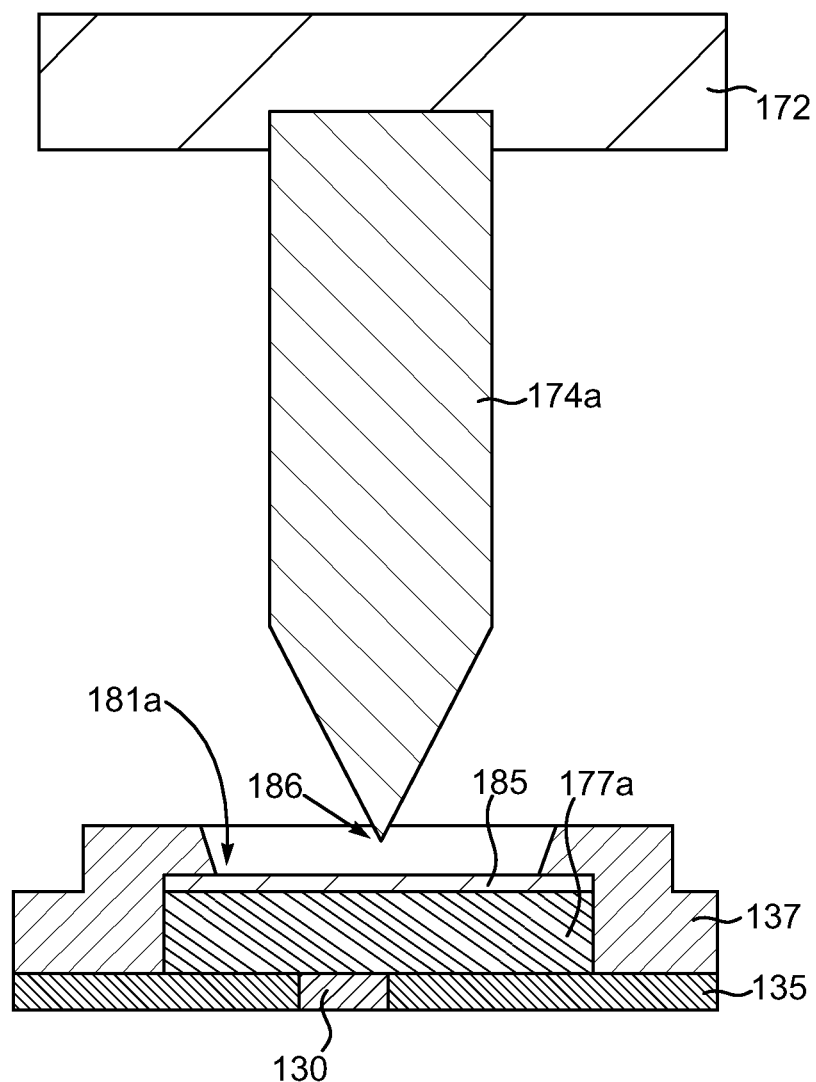
FIG. 3 is a section view depicting a small portion of a semiconductor chip undergoing conventional probe testing.

Attention is now turned to FIG. 3, which is a portion of FIG. 2 circumscribed by the dashed rectangle 183 in FIG. 2 shown at greater magnification. Note that because of the location of the dashed rectangle 183, small portions of the via 130, the passivation layers 135 and 137 and the probe card 172 are shown in FIG. 3. As noted above, the conventional aluminum test pad 177*a* has a naturally occurring aluminum oxide layer 185 that is relatively resistive and thus must be broken through by a sharpened tip 186 of the probe pin 174*a* in order to establish good ohmic contact with the underlying aluminum pad 177*a*. FIG. 3 depicts the approach of the probe pin 174*a* towards the aluminum oxide film and the underlying pad 177*a*. As noted above, the access to the probe pad 177*a* is by way of the opening 181*a* in the passivation layer 137.

Figure 4:
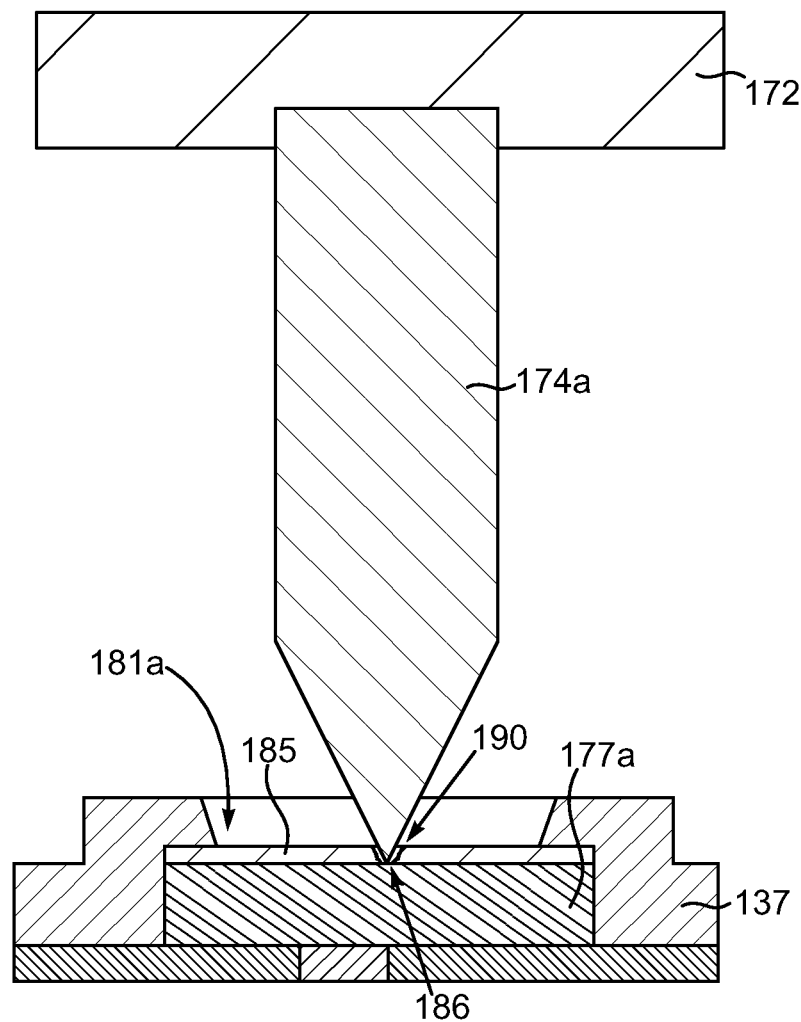
FIG. 4 is a sectional view like FIG. 3 but depicting native oxide penetration in a conventional probe testing procedure.

Next and as shown in FIG. 4, the probe card 172 and the probe pin 174*a* must be forcefully moved downward so that the sharpened tip 186 of the probe pin 174*a* fractures the native oxide film 185, for example, at the location 190 and establishes ohmic contact with the underlying probe pad 177*a*. This impact loading of the probe pin 174*a* causes significant wear of the tip 186 and therefore reduces the life span of the probe card 172. Of course, it is a goal to ensure that the probe pin 174*a* enters the opening 181*a* and does not impact the passivation layer 137.

Figure 5:
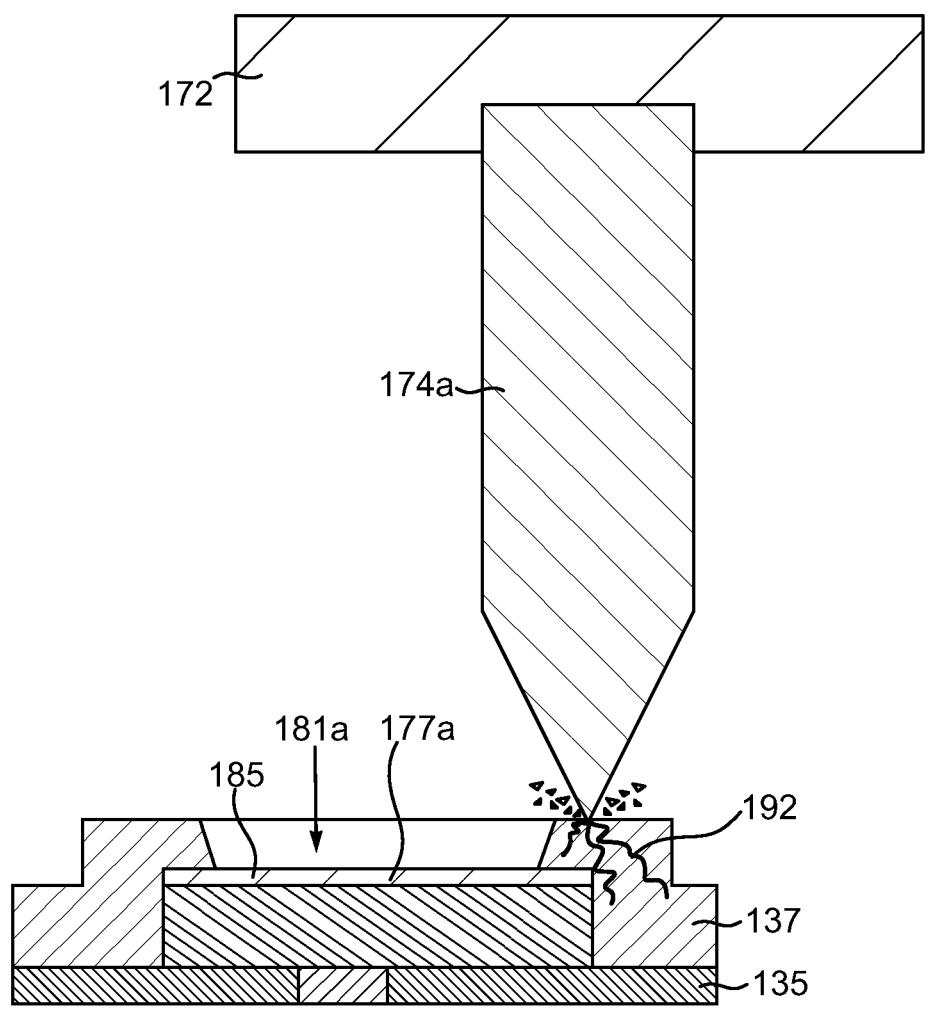
FIG. 5 is a sectional view like FIG. 4 but depicting a potential outcome of conventional probe pin misalignment.

One other pitfall associated with the usage of the conventional probe card 172 and associated pin 174*a* is illustrated in FIG. 5. Perfect alignment of the probe pin 174*a* with the opening 181*a* is not always achieved. If, as shown in FIG. 5, there is a significant enough misalignment between the probe pin 174*a* and the opening 181*a*, the probe pin 174*a* will miss the opening 181*a* entirely, not impact the native oxide layer 185, and instead impact the upper surface of the passivation layer 137 and produce cracking as shown at location 192. Not only will this not result in an inaccurate probe test, but the outcome is a potentially damaged passivation layer 137, which can cause portions thereof to delaminate from the underlying passivation layer 135. One other pitfall is a requirement to realign the probe card 172 (and thus the pin 174*a*) after probing every grouping of dice, with an attendant time and cost penalty. None of these outcomes is desirable.

Figure 6:
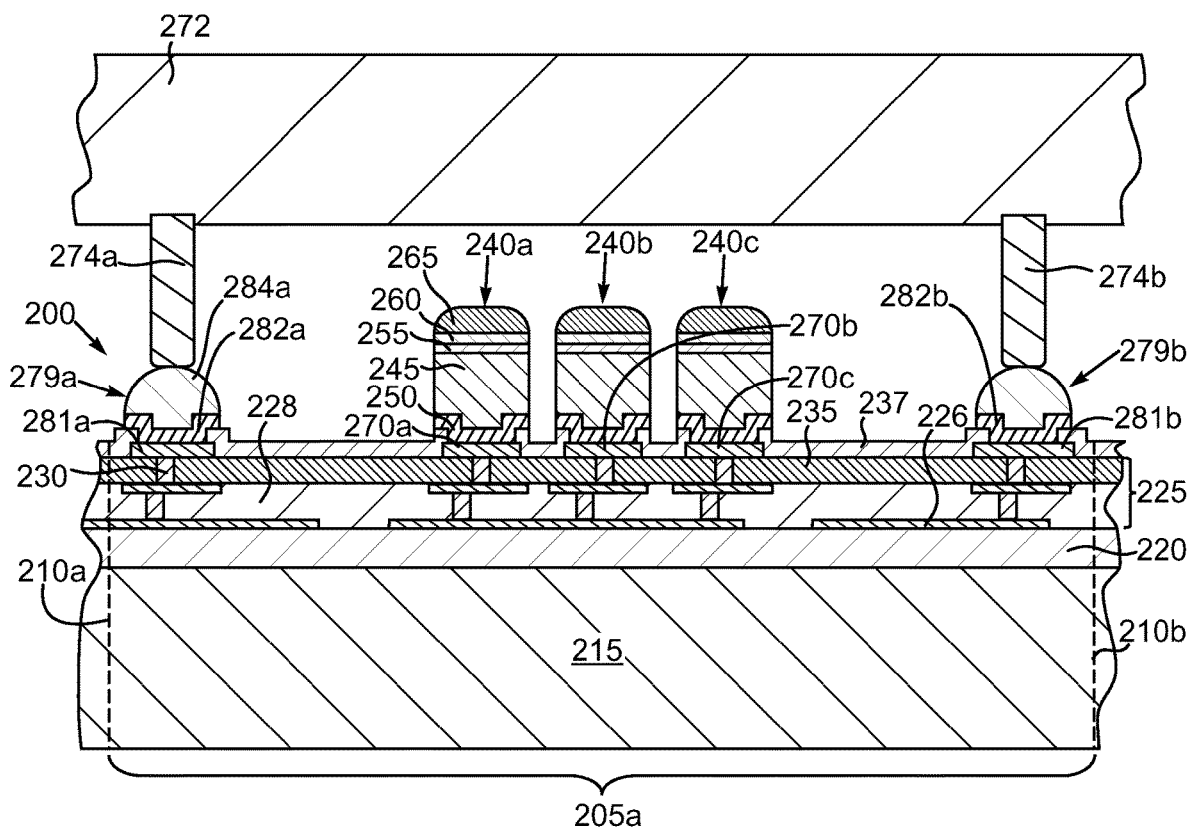
FIG. 6 is a sectional view depicting a new arrangement of a semiconductor chip undergoing probe testing.

FIG. 6 is a sectional view of an exemplary new arrangement of a semiconductor wafer 200 that includes plural semiconductor chips, one of which is shown and labeled 205*a*. The semiconductor chip 205*a* is delineated laterally by dashed lines 210*a* and 210*b*, respectively. The semiconductor wafer 200 includes scores of such chips 205*a*. The semiconductor chip 205*a* includes a base substrate 215, which can be composed of silicon, germanium, semiconductor or insulator such as silicon on sapphire or other types of semiconductor substrate materials. A device region 220 is fabricated on the substrate 215 and includes large numbers of circuit elements, such as transistors, capacitors, resistors, and others that make up multitudes of logic elements etc. A metallization stack 225 is fabricated on the device region 220 and includes plural metallization layers and interlevel dielectric layers. The metallization layers can include conductor traces 226 interconnected by conductive vias 230. One exemplary interlevel dielectric layer is shown and labeled 228. A passivation layer 235 is fabricated as part of the metallization stack 225 and can be composed of various well-known passivation materials such as SiOx, silicon nitride, silicon oxynitride, or even a polymer materials, such as polyimide or benzocyclobutene.

To electrically interface with another structure, such as a circuit board (not shown), the semiconductor chip 205*a* is fabricated with plural input/output (I/O) structures 240*a*, 240*b* and 240*c* respectively. The skilled artisan will appreciate that there may be scores, hundreds or even thousands of such I/O structures 240*a*, 240*b* and 240*c*. The I/O structures 240*a*, 240*b* and 240*c* are operable to convey power, ground and/or signals. In this illustrative arrangement, the I/O structures 240*a*, 240*b* and 240*c* are microbumps. However, solder bumps, conductive pillars or other types of I/O structures could be used. Each of the I/O structures 240*a*, 240*b* and 240*c* consists of a pillar portion 245 fabricated on a seed layer 250 and topped by a barrier layer 255 formed on the pillar portion 245, a solderable layer 260 formed on the barrier layer 255 and a solder cap 265 formed on the solderable layer 255. The seed layer 250 is fabricated on and in electrical contact with an underlying bump pad 270*a* and the I/O structures 240*b* and 240*c* are similarly fabricated on bump pads 270*b* and 270*c*. The seed layer 250 can be composed of copper, titanium, or other like materials that facilitate subsequent plating, and can be applied using well-known sputtering techniques. The pillar portion 245 can be composed of copper, aluminum, gold, silver, platinum, palladium, alloys of these or the like, and be applied using well-known plating techniques. The barrier layer 155 is designed to prevent diffusion of materials into or out of the solder cap 265. The barrier layer 255 can be composed of nickel, vanadium or the like and applied using well-known plating techniques. The solderable layer 260 serves as a layer that exhibits better wetting and bonding to solder than the barrier layer 255. The solderable layer 260 can be composed of the same types of materials as the pillar portion 245 and applied using well-known plating techniques. The solder cap 265 can be composed of tin-silver, tin-silver-copper or like lead-free solders and can be applied by well-known stencil, plating or pick and place techniques.

The I/O structures 240*a*, 240*b* and 240*c* are fabricated on respective conductive pads 270*a*, 270*b* and 270*c*. The bump pads 270*a*, 270*b* and 270*c* are part of an uppermost metallization layer of the stack 225 and can be composed of can be composed of copper, aluminum, gold, silver, platinum, palladium, alloys of these or the like, and be applied using well-known sputtering and etching or plating techniques. Like the conventional semiconductor chip 105*a* depicted in FIG. 2 and described above, it is desirable to electrically probe the semiconductor chip 205*a* using a probe card 272 (connected to a prober not shown) that has multitudes of probe pins 274*a* and 274*b*. However, and for the same reasons discussed earlier, it is impractical to directly probe the I/O structures 240*a*, 240*b* and 240*c* with the probe pins 274*a* and 274*b*. This is primarily due to the fact that the I/O structures 240*a*, 240*b* and 240*c* have a spacing or pitch and a size that are too small for typical probe cards. Accordingly, the semiconductor chip 205*a* is manufactured with solder-based probe pads 279*a* and 279*b* and plural additional such probe pads that are not visible in FIG. 6. The probe pad 279*a* consists of an underlying conductor pad 281*a*, a seed layer 282*a* and a solder cap 284*a*. The probe pad 279*b* is similarly constructed. The conductor pads 281*a* and 281*b* can be constructed of the same materials as the pads 270*a*, 270*b* and 270*c*. The seed layers 282*a* and 282*b* can be constructed of the same materials as the seed layers 250 discussed above. The solder caps 284*a* and 284*b* can be constructed of the same types of solders as the solder caps 265 discussed above. The usage of probe pads 279*a* and 279*b* with solder caps 284*a* and 284*b*, respectively, has several advantages. First, the solder caps 284*a* and 284*b* softer than a conventional aluminum probe pad and do not present a hard oxide layer that must be fractured like the native oxide film 185 shown in FIGS. 3-5 and discussed above. Accordingly, the need for sharpened probe pin tips is eliminated, and flat tipped probe pins 274*a* and 274*b* can be used, and with less impact loading and longer pin lifespan. Furthermore, the solder caps 284*a* and 284*b* present larger targets for the pins 274*a* and 274*b* than typical aluminum probe pads and thus reduce the risk of misalignments causing damage to the passivation layer 237 and the necessity to realign the probe card 272 and pins 274a and 274b. Finally, the lesser impact loading and flat tips of the pins 274a and 274b increases the chances that impact of the passivation layer 237 due to misalignment of the pins 274a and 274b will not cause cracking.

Figure 7:
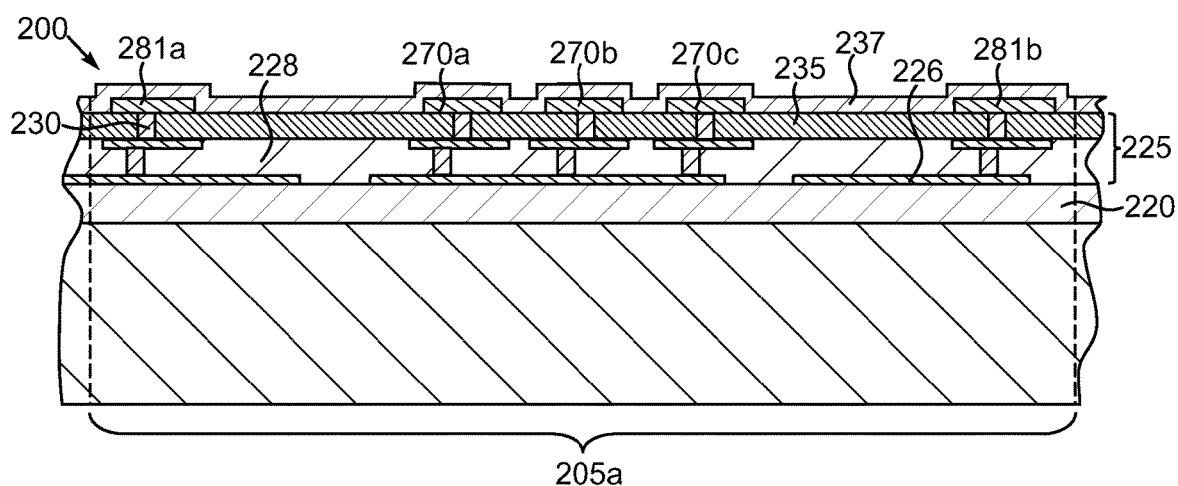
FIG. 7 is a sectional view depicting preliminary processing to fabricate structures for the semiconductor chips.

An exemplary process for fabricating the semiconductor chip 205a can be understood by referring now to FIGS. 7, 8, 9, 10, 11, 12, 13, 14, 15 and 16 and initially to FIG. 7, which is a sectional view depicting the semiconductor wafer 200 and the semiconductor chip 205a thereof in a state of partial manufacture. It should be understood that the semiconductor chip 205a can be constructed to be virtually any type of integrated circuit. A non-exhaustive list includes microprocessors, graphics processing units, accelerated processing units that combine aspects of both, memory devices, an application integrated specific circuit or other. Up to the point depicted in FIG. 7, the semiconductor chip 205a has undergone a multitude of processing steps to fabricate the device region 220, the metallization stack 225 including the passivation layer 235 and the passivation layer 237. Of course this entails the fabrication of the conductive traces 226, the vias 230, the uppermost conductor pads 270a, 270b and 270c, and the pads 281a and 281b which will ultimately form part of the probe pads 279a and 279b shown in FIG. 6. The device region 220 is fabricated using well-known semiconductor circuit element fabrication techniques such as etching, metal deposition, interlevel dielectric deposition, etc. The same is true for the metallization stack 225. Following the fabrication of the pads 270a, 270b and 270c and 281a and 281b, the passivation layer 237 is fabricated over the passivation layer 235 and of course the pads 270a, 270b and 270c and 281a and 281b. The passivation layers 235 and 237 are advantageously fabricated using well-known CVD techniques and the materials discussed above, and can be constructed as unitary or laminate structures.

Figure 8:
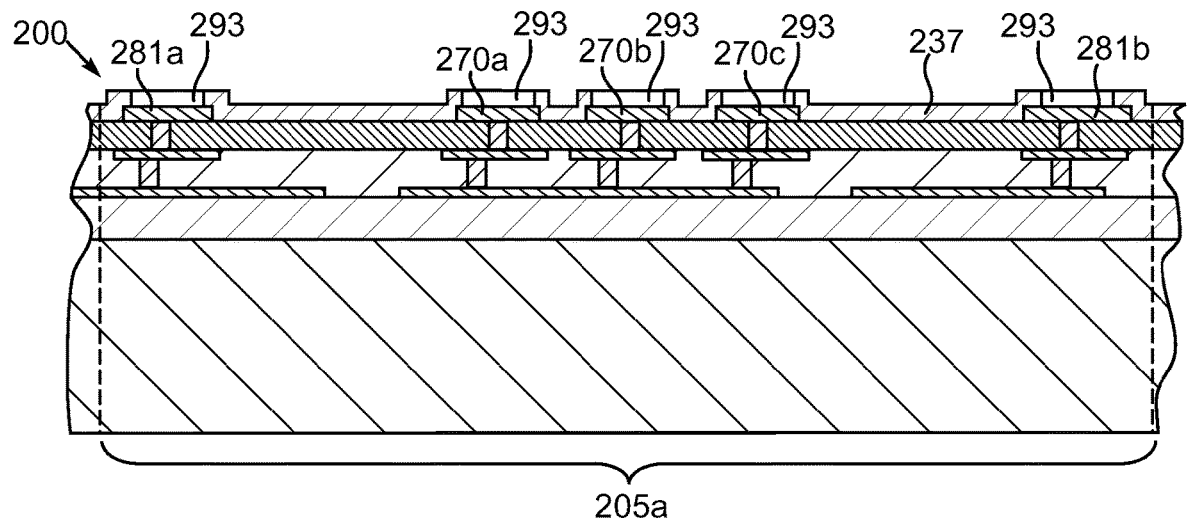
FIG. 8 is a sectional view like FIG. 7 depicting additional processing.

Next and as shown in FIG. 8, suitable openings 293 are formed in the passivation layer 237 of the semiconductor chip 205a to expose portions of the pads 270a, 270b, 270c, 281a and 281b. The openings 293 are advantageously fabricated by suitable masking and directional etching of the passivation layer 237. Following the etch, the mask (not shown) is removed from the chip 205a using well-known solvent stripping, ashing or other techniques.

Figure 9:
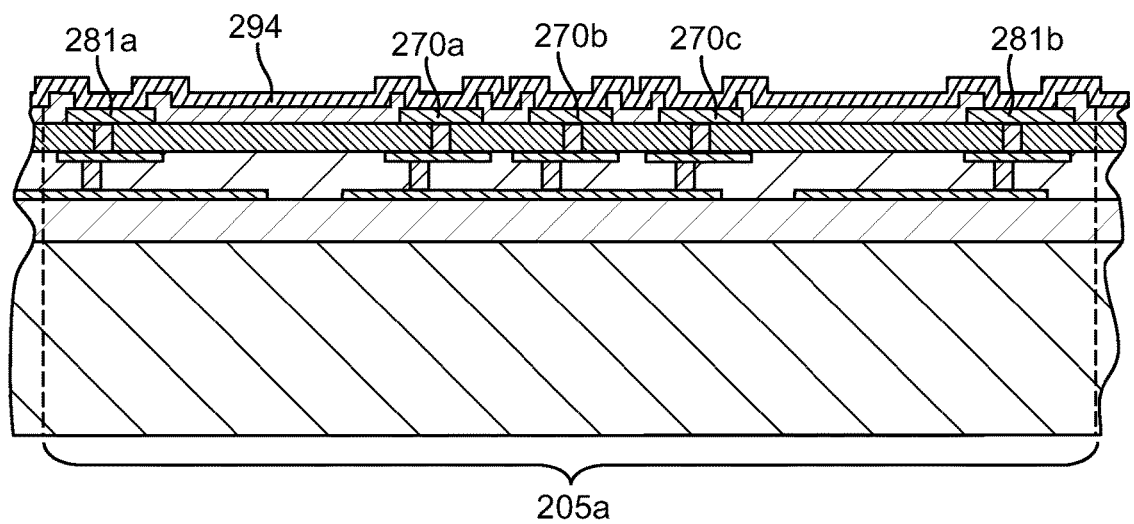
FIG. 9 is a sectional view like FIG. 8 but depicting additional processing.

Next and as shown in FIG. 9, a plating seed layer 294 is applied over the passivation layer 237 of the semiconductor chip 205a. The plating seed layer 294 will be ultimately patterned into the seed layers 250, 282a and 282b shown in FIG. 6. The seed layer 294 is advantageously applied by way of well-known sputtering techniques and the seed layer materials discussed above. Of course the seed layer 294 is formed in ohmic contact with the underlying pads 270a, 270b and 270c and the pads 281a and 281b by way of the now filled openings 293.

Figure 10:
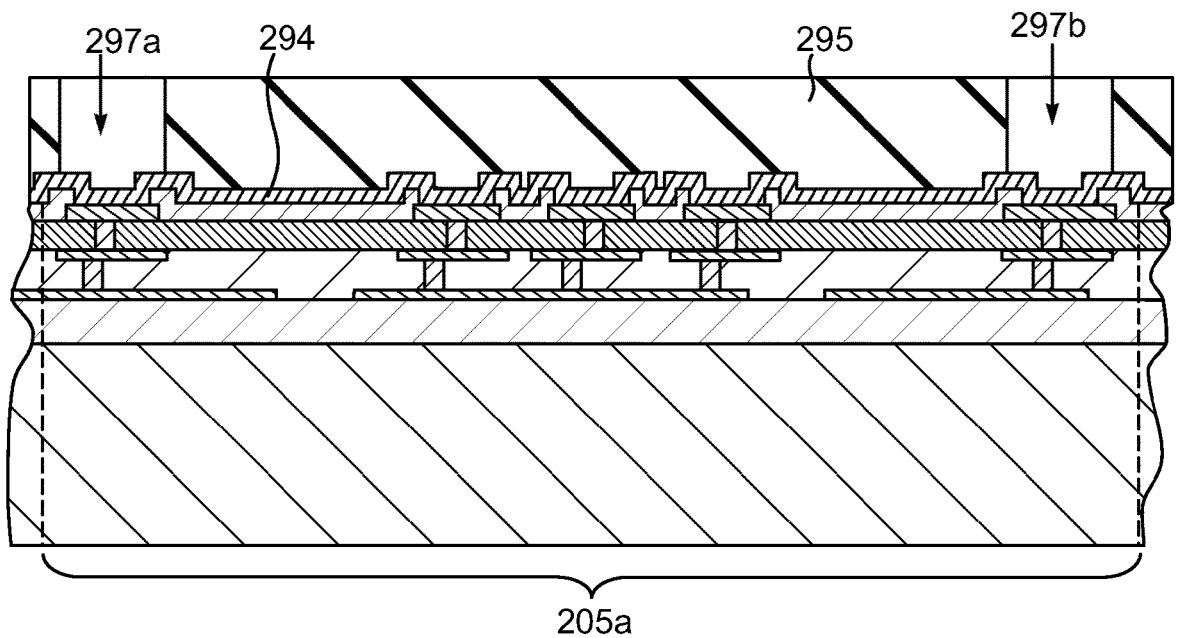
FIG. 10 is a sectional view like FIG. 9 but depicting additional processing.

Next and as shown in FIG. 10, a suitable photoresist mask 295 is fabricated over the metallization seed layer 294 of the semiconductor chip 205a and patterned lithographically with suitable openings 297a and 297b at the locations of the subsequently formed solder caps 284a and 284b also depicted in FIG. 6. Well-known spin coating, baking, masking, exposure development steps can be used to apply the photoresist mask 295 and fabricate the openings 297a and 297b therein.

Figure 11:
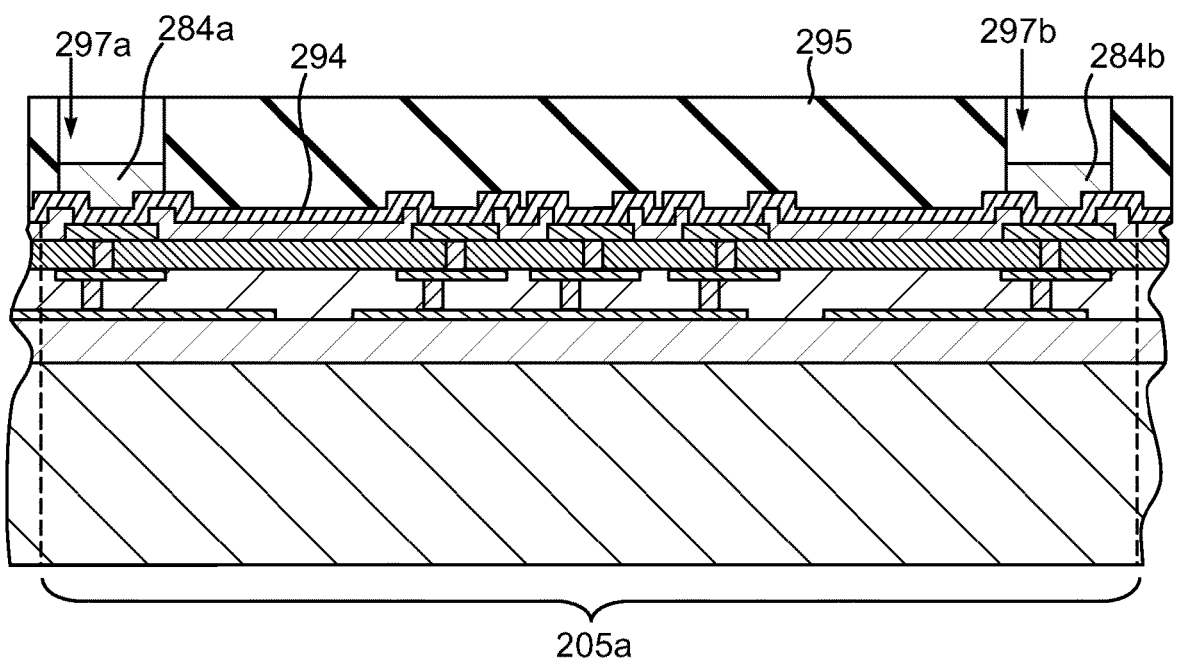
FIG. 11 is a sectional view like FIG. 10 but depicting exemplary test pad solder cap fabrication.

Next and as shown in FIG. 11, the solder caps 284a and 284b of the semiconductor chip 205a are fabricated in the openings 297a and 297b using well-known plating techniques and the materials discussed above in conjunction with FIG. 6. The plating process can be a biased plating process that utilizes the seed layer 294 as a conductive layer to facilitate the electrical biasing during the plating process.

Figure 12:
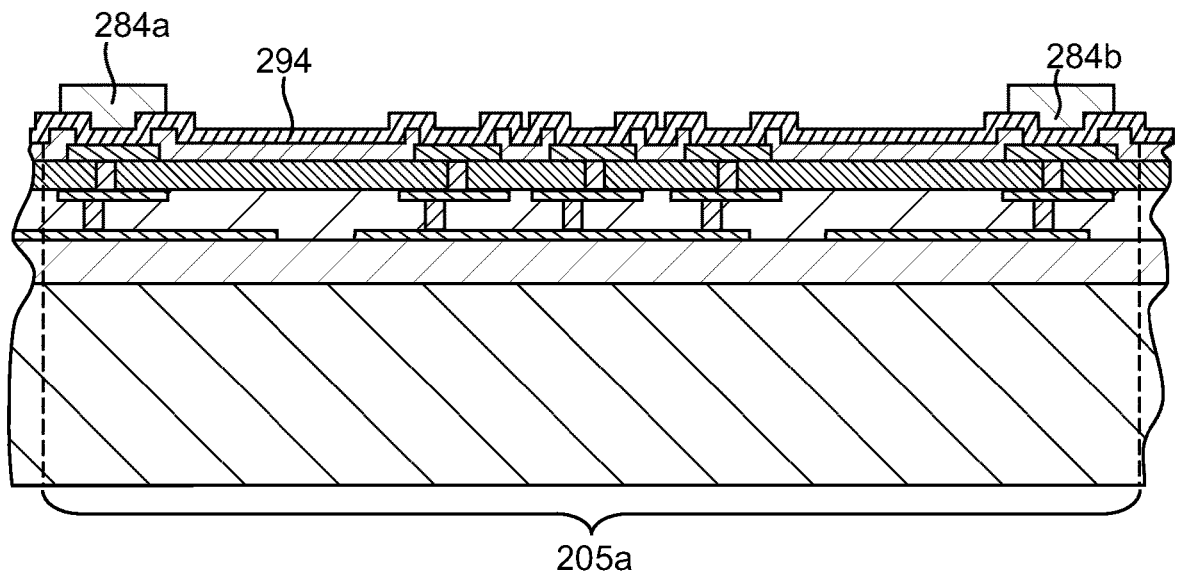
FIG. 12 is a sectional view like FIG. 11 but depicting additional processing.

Next and as shown in FIG. 12, the photoresist mask 295 depicted in FIGS. 10 and 11 is stripped using well-known ashing and solvent stripping techniques to expose the metallization seed layer 294 and the solder caps 284a and 284b. The fabrication steps to complete the construction of the I/O structures 240a, 240b and 240c will now be described in conjunction with FIGS. 13, 14, 15 and 16.

Figure 13:
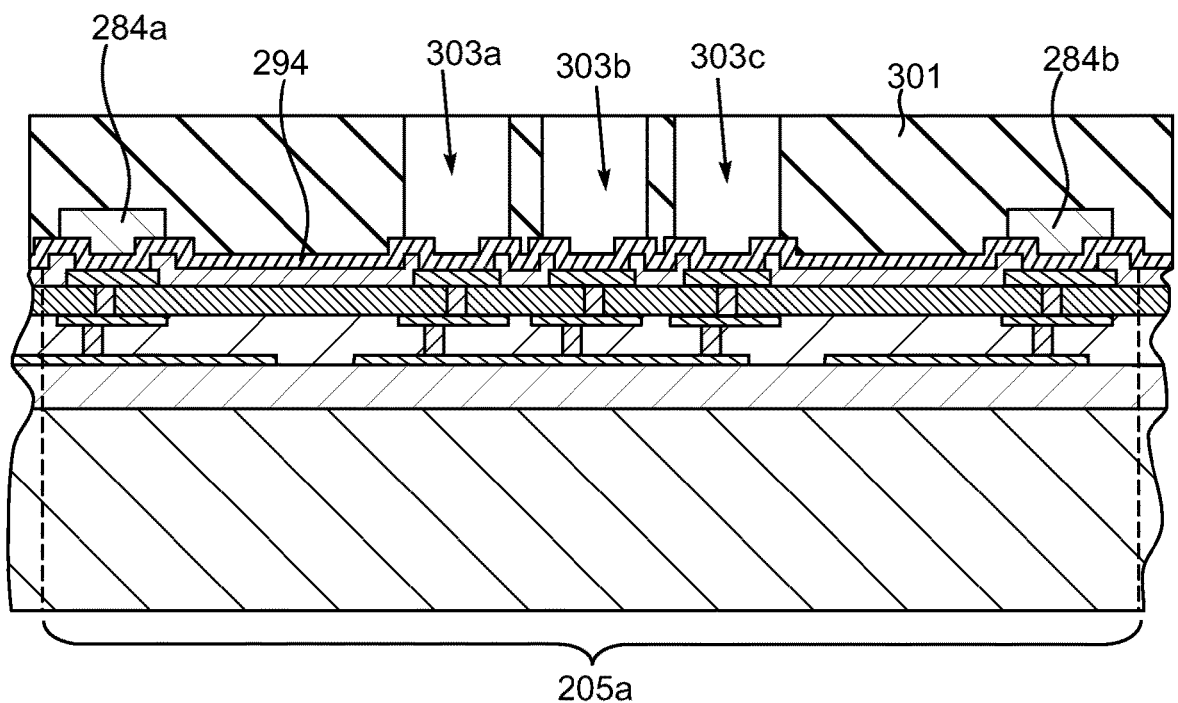
FIG. 13 is a sectional view like FIG. 12 but depicting additional processing.

Referring initially to FIG. 13, a photoresist mask 301 is fabricated on the semiconductor chip 205a and particularly on the metallization seed layer 294 and over the solder caps 284a and 284b and patterned to establish suitable openings 303a, 303b and 303c at positions where the I/O structures 240a, 240b and 240c shown in FIG. 6 will be subsequently fabricated. The same types of techniques described above for the fabrication and patterning of the photoresist mask 295 can be used for the photoresist mask 301 as well.

Figure 14:
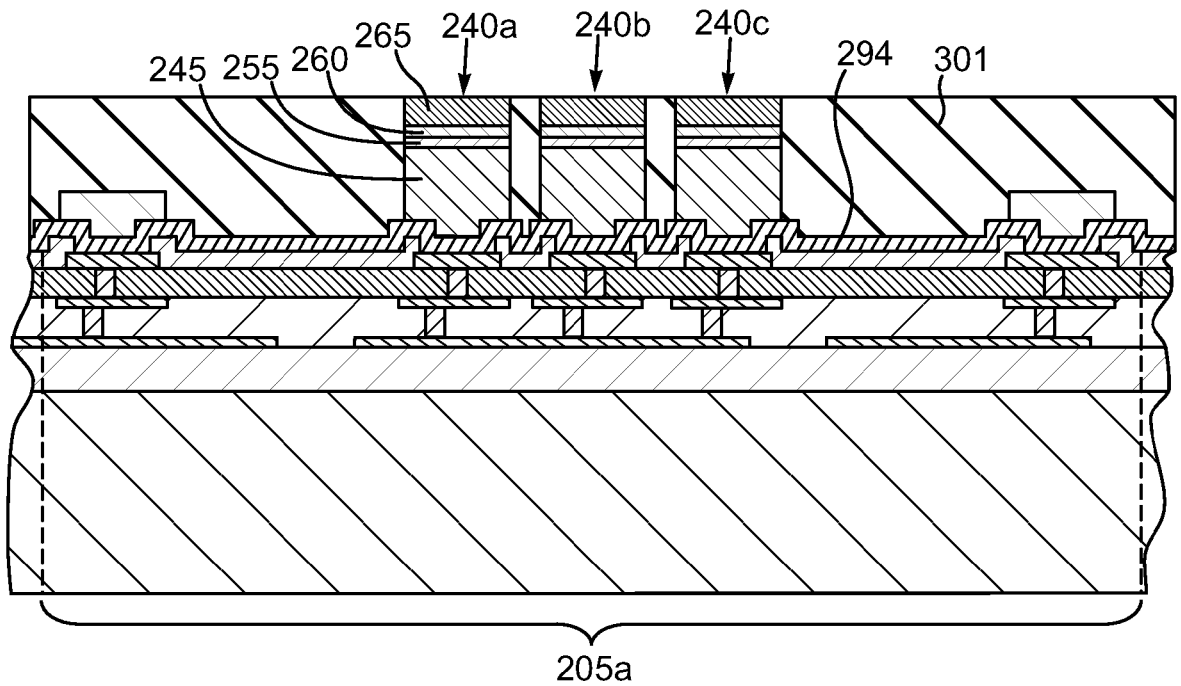
FIG. 14 is a sectional view like FIG. 13 but depicting exemplary I/O structure fabrication.

Next and as shown in FIG. 14, a plurality of plating processes are performed on the semiconductor chip 205a to construct the I/O structures 240a, 240b and 240c with the photoresist mask 301 in position. The pillar portions 245 are constructed on the plating seed layer 294 using well-known plating processes, the barrier layers 255 are constructed on the pillar portions 245 using well-known plating processes, the solderable layers 260 are fabricated on the barrier layers 255 using well-known plating processes and of course the solder caps 265 are fabricated on the solderable layers 260 using well-known plating processes.

Figure 15:
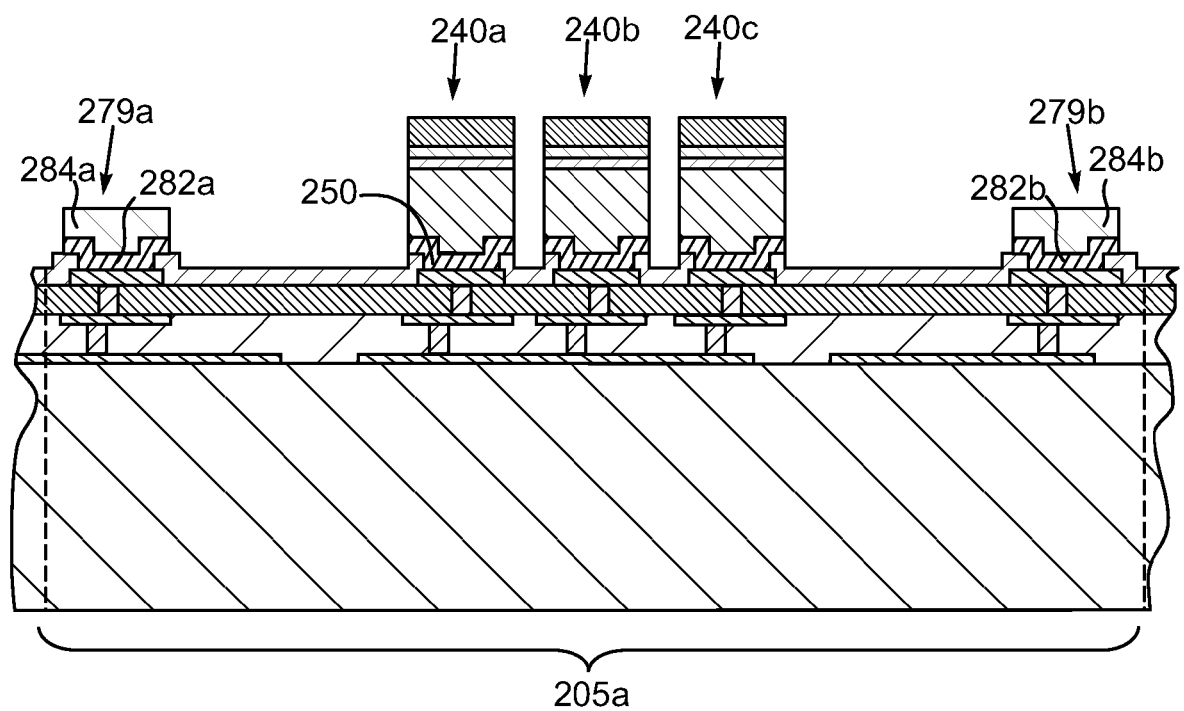
FIG. 15 is a sectional view like FIG. 14 but depicting additional processing.

As shown in FIG. 15, following the various steps to fabricate the I/O structures 240a, 240b and 240c, the photoresist mask 301 shown in FIG. 14 is stripped from the semiconductor chip 205a using well-known ashing and solvent stripping techniques to expose the I/O structures 240a, 240b and 240c and the test pads 279a and 279b, which include the aforementioned solder caps 284a and 284b and the underlying seed layers 282a and 282b. Following stripping of the photoresist mask 301, an etch process is performed to remove exposed portions of the metallization seed layer 294 shown in FIG. 14 to yield the individual seed layers 282a and 282b and each of the seed layers 250 for the I/O structures 240a, 240b and 240c. Well-known wet etching techniques with or without plasma enhancement can be used.

Figure 16:
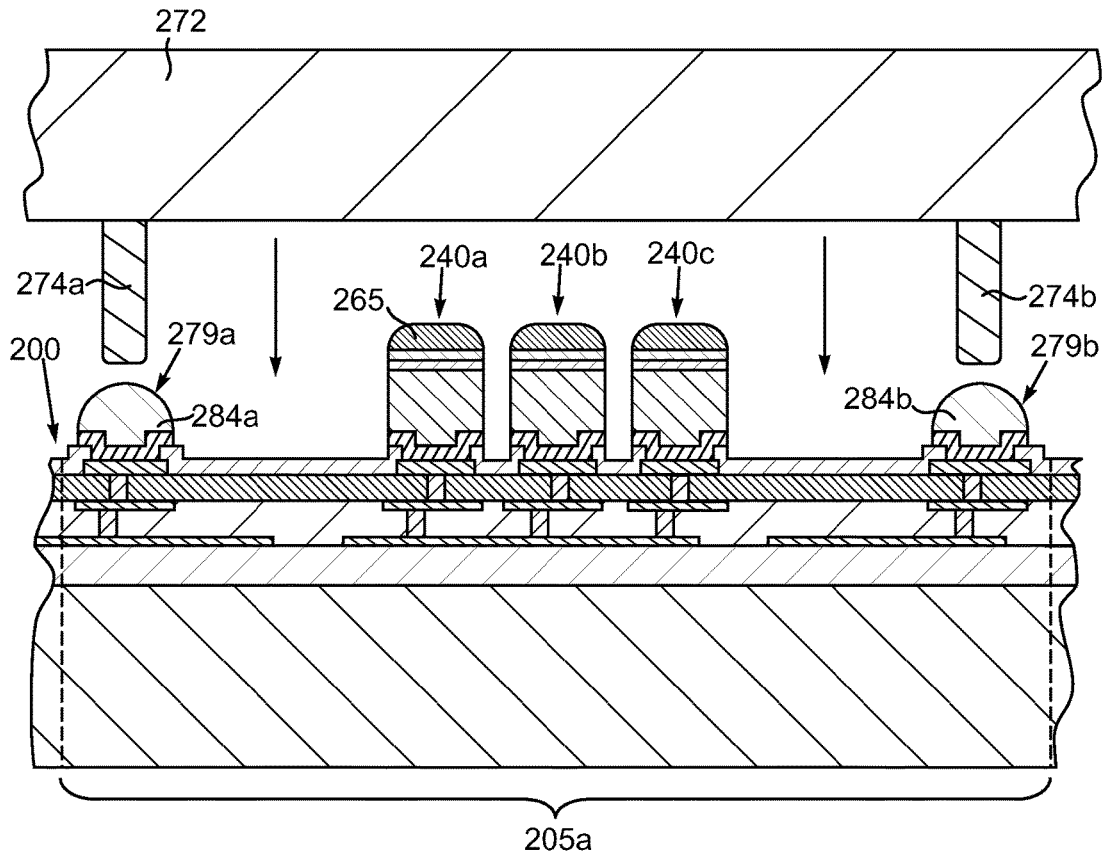
FIG. 16 is a sectional view like FIG. 15 but depicting exemplary solder cap reflow and probe testing.

Next and as shown in FIG. 16, a suitable reflow process is performed to temporarily liquify the solder caps 265 of each of the I/O structures 240a, 240b and 240c and the solder caps 284a and 284b of the test pads 279a and 279b. At this point, the probe card 272 can be brought into contact with the test pads 279a and 279b by way of the aforementioned probe pins 274a and 274b, and of course others that are not shown, and the semiconductor chip 205a probe tested. Of course other types of probe pins could be used to probe the test pads 279a and 279b. Other chips of the wafer 200 can be probe tested as well. The probe testing can include continuity testing, running various types of test scripts or other tests.

Figure 17:
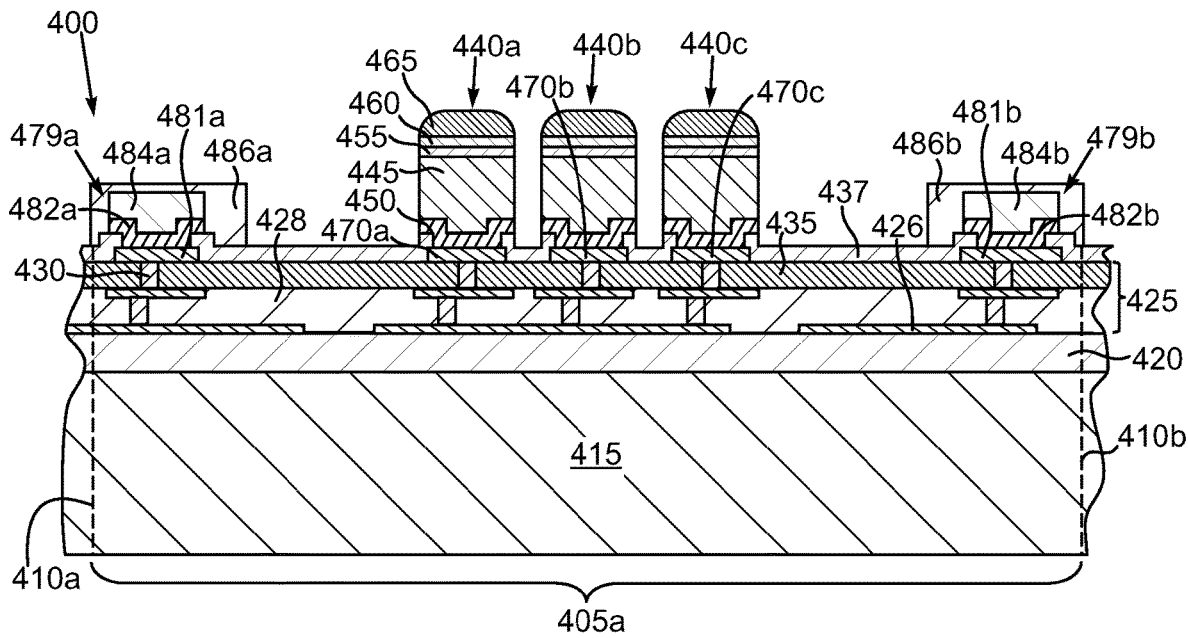
FIG. 17 is a sectional view like FIG. 6 but depicting an alternate exemplary semiconductor chip with solder cap probe test pads.

In the arrangement illustrated in FIGS. 6, 7, 8, 9, 10, 11, 12, 13, 14, 15 and 16, probe testing is performed after the solder caps 284a and 284b of the pads 279a and 279b have been subjected to a reflow process. However, by altering the process flow for fabricating solder cap test pads, testing can be done at an earlier stage in the overall process to complete the chips. For example, FIG. 17 is a sectional view like FIG. 6 but of an alternate exemplary new arrangement of a semiconductor wafer 400 that includes multitudes of semiconductor chips, one of which is shown at labeled 405a. The semiconductor chip 405a is delineated laterally by dashed lines 410a and 410b respectively. The semiconductor wafer 400 includes scores of such chips 405a. The semiconductor chip 405a can be substantially identical to the semiconductor chip 205a described above with a few notable exceptions. Accordingly, the semiconductor chip 405a includes a base substrate 415, which can be composed of silicon, germanium, semiconductor on insulator such as silicon on sapphire or other types of semiconductor substrate materials. A device region 420 is fabricated on the substrate 415 and includes large numbers of circuit elements, such as transistors, capacitors, resistors, and others that make up multitudes of logic elements etc. A metallization stack 425 is fabricated on the device region 420 and includes plural metallization layers and interlevel dielectric layers. The metallization layers can include conductor traces 426 interconnected by conductive vias 430. One exemplary interlevel dielectric layer is shown and labeled 428. A passivation layer 435 is fabricated as part of the metallization stack 425 and can be composed of various well-known passivation materials such as SiOx, silicon nitride, silicon oxynitride, or even polymer materials, such as polyimide or benzocyclobutene.

To electrically interface with another structure, such as a circuit board (not shown), the semiconductor chip 405a is fabricated with plural I/O structures 440a, 440b and 440c, respectively. The skilled artisan will appreciate that there may be scores, hundreds or even thousands of such I/O structures 440a, 440b and 440c. The I/O structures 440a, 440b and 440c are operable to convey power, ground and/or signals. In this illustrative arrangement, the I/O structures 440a, 440b and 440c are microbumps. However, solder bumps, conductive pillars or other types of I/O structures could be used. Each of the I/O structures 440a, 440b and 440c consists of a pillar portion 445 fabricated on a seed layer 450 and topped by a barrier layer 455 formed on the pillar portion 445, a solderable layer 460 formed on the barrier layer 455 and a solder cap 465 formed on the solderable layer 455. The seed layer 450 is fabricated on and in electrical contact with an underlying bump pad 470a and the I/O structures 440b and 440c are similarly fabricated on bump pads 470b and 470c. The seed layer 450 can be composed of copper, titanium, or other like materials that facilitate subsequent plating, and can be applied using well-known sputtering techniques. The pillar portion 445 can be composed of copper, aluminum, gold, silver, platinum, palladium, alloys of these or the like, and be applied using well-known plating techniques. The barrier layer 455 is designed to prevent diffusion of materials into or out of the solder cap 465. The barrier layer 455 can be composed of nickel, vanadium or the like and applied using well-known plating techniques. The solderable layer 460 serves as a layer that exhibits better wetting and bonding to solder than the barrier layer 455. The solderable layer 460 can be composed of the same types of materials as the pillar portion 445 and applied using well-known plating techniques. The solder cap 465 can be composed of tin-silver, tin-silver-copper or like lead-free solders and can be applied by well-known stencil, plating or pick and place techniques.

The I/O structures 440a, 440b and 440c are fabricated on respective bump pads 470a, 470b and 470c. The bump pads 470a, 470b and 470c are part of an uppermost metallization layer of the stack 425 and can be composed of copper, aluminum, gold, silver, platinum, palladium, alloys of these or the like, and be applied using well-known sputtering and etching or plating techniques. Like the semiconductor chip 205a depicted in FIG. 6 and described above, it is desirable to electrically probe the semiconductor chip 405a using the probe card 274 that has multitudes of probe pins 274a and 274b. However, and for the same reasons discussed earlier, it is impractical to directly probe the I/O structures 440a, 440b and 440c with the probe pins 274a and 274b shown in FIG. 6. This is primarily due to the fact that the I/O structures 440a, 440b and 440c have a spacing or pitch and size that are too fine for typical probe cards. Accordingly, the semiconductor chip 405a is manufactured with solder-based probe pads 479a and 479b and plural additional such probe pads that are not visible in FIG. 17. The probe pad 479a consists of an underlying conductor pad 481a, a seed layer 482a and a solder cap 484a. The probe pad 479b is similarly constructed with a conductor pad 481b, a seed layer 482b and a solder cap 484b. The conductor pads 481a and 481b can be constructed of the same materials as the pads 470a, 470b and 470c. The seed layers 482a and 482b can be constructed of the same materials as the seed layers 450 discussed above. The solder caps 484a and 484b can be constructed of the same types of solders as the solder caps 465 discussed above. The usage of probe pads 479a and 479b with solder caps 484a and 484b, respectively, has the several advantages discussed above for the semiconductor chip 205a.

The arrangement of the semiconductor chip 405a differs from the semiconductor chip 205a principally in that the solder caps 484a and 484b are covered with respective polymer films 486a and 486b and the solder caps 484a and 484b have not yet been subjected to reflow but have been utilized to electrically probe test the semiconductor chip 405a prior to the reflow process to liquify the solder caps 465 of the I/O structures 440a, 440b and 440c. The polymer films 486a and 486b can be constructed of various polymeric materials. Exemplary examples include polyimide, benzocyclobutene, polybenzoxazoles or the like. Infusion with photoactive compounds can make the patterning of the polymer films 486a and 486b a matter of photolithography.

Figure 18:
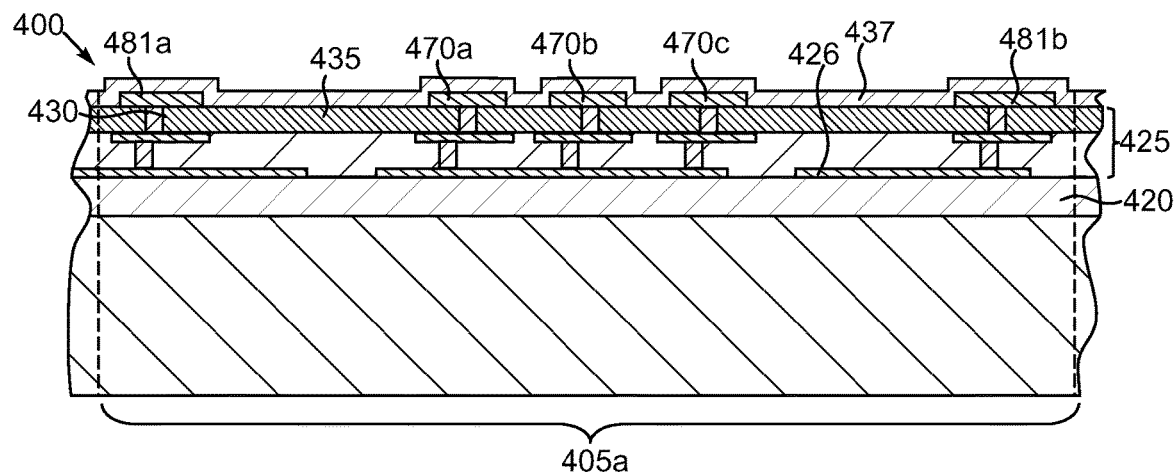
FIG. 18 is a sectional view depicting initial processing of a semiconductor chip.

An exemplary process for fabricating the semiconductor chip 405a can be understood by referring now to FIGS. 18, 19, 20, 21, 22, 23, 24, 25, 26 and 27 and initially to FIG. 18. FIG. 18 is a sectional view like FIG. 7, but depicting the semiconductor wafer 400 and the semiconductor chip 405a thereof in a state of partial manufacture. It should be understood that the semiconductor chip 405a can be constructed to be virtually any type of integrated circuit. A non-exhaustive list includes microprocessors, graphics processing units, accelerated processing units that combine aspects of both, memory devices, an application integrated specific circuit or other. Up to the point depicted in FIG. 18, the semiconductor chip 405a has undergone a multitude of processing steps to fabricate the device region 420, the metallization stack 425 including the passivation layer 435 and the passivation layer 437. Of course this entails the fabrication of the conductive traces 426, the vias 430, the uppermost conductor pads 470a, 470b and 470c, and the pads 481a and 481b which will ultimately form part of the probe pads 479a and 479b shown in FIG. 17. The device region 420 is fabricated using well-known semiconductor circuit element fabrication techniques such as etching, metal deposition, interlevel dielectric deposition, etc. The same is true for the metallization stack 425. Following the fabrication of the pads 470a, 470b and 470c and 481a and 481b, the passivation layer 437 is fabricated over the passivation layer 435 and of course the pads 470a, 470b and 470c and 481a and 481b. The passivation layers 435 and 437 are advantageously fabricated using well-known CVD techniques and the materials discussed above, and can be constructed as unitary or laminate structures.

Figure 19:
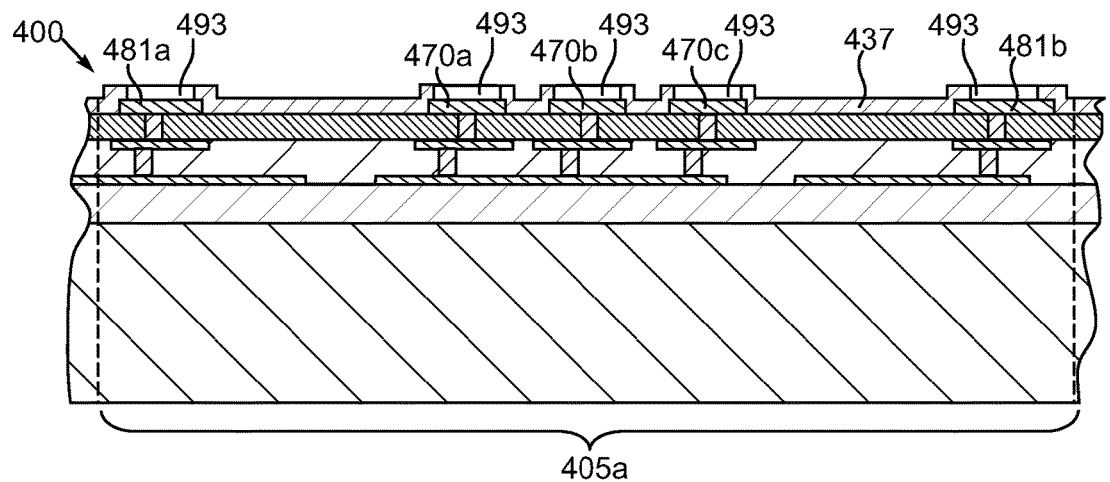
FIG. 19 is a sectional view like FIG. 18 but depicting additional processing.

Next and as shown in FIG. 19, suitable openings 493 are formed in the passivation layer 437 of the semiconductor chip 405a to expose portions of the pads 470a, 470b, 470c, 481a and 481b. The openings 493 are advantageously fabricated by suitable masking and directional etching of the passivation layer 437. Following the etch, the mask (not shown) is removed from the chip 405a using well-known solvent stripping, ashing or other techniques.

Figure 20:
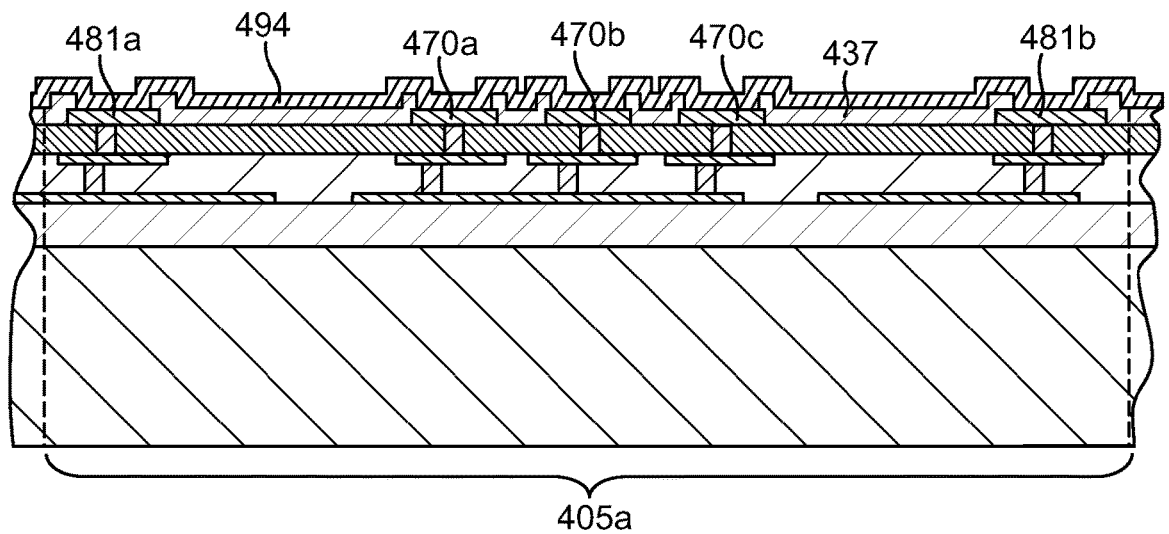
FIG. 20 is a sectional view like FIG. 19 but depicting additional processing.

Next and as shown in FIG. 20, a plating seed layer 494 is applied over the passivation layer 437 of the semiconductor chip 405a. The plating seed layer 494 will be ultimately patterned into the seed layers 450 and 482a and 482b shown in FIG. 17. The seed layer 494 is advantageously applied by way of well-known sputtering techniques and the seed layer materials discussed above. Of course the seed layer 494 is formed in ohmic contact with the underlying pads 470a, 470b and 470c and the pads 481a and 481b by way of the now filled openings 493 (see FIG. 19).

Figure 21:
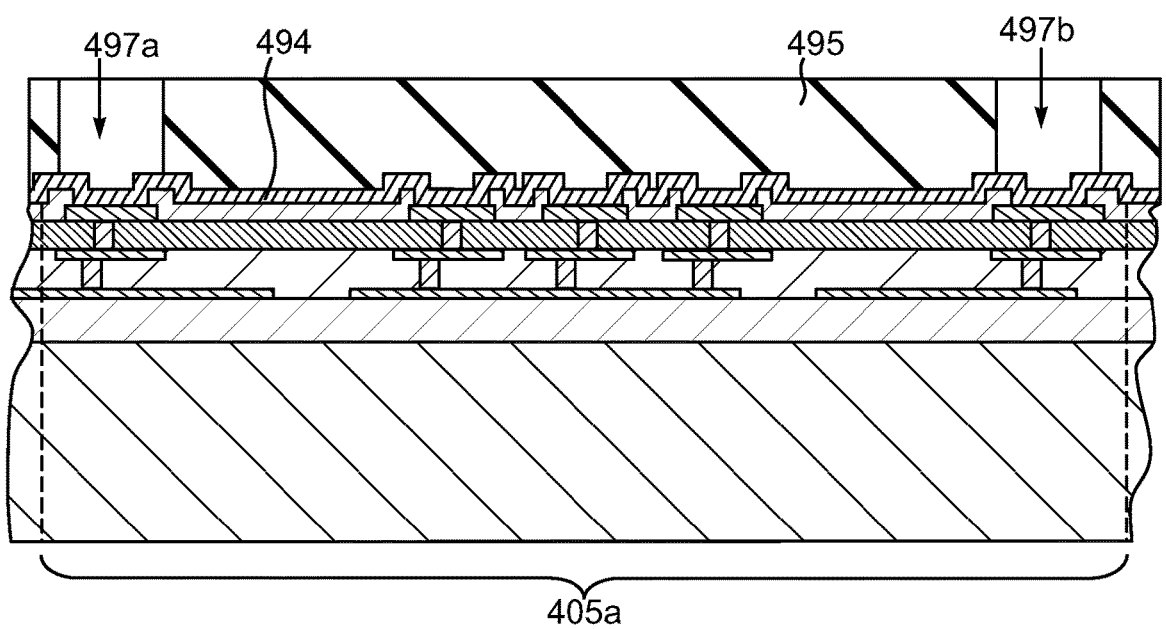
FIG. 21 is a sectional view like FIG. 20 but depicting additional processing.

Next and as shown in FIG. 21, a suitable photoresist mask 495 is fabricated over the metallization seed layer 494 and patterned lithographically with suitable openings 497a and 497b at the locations of the subsequently formed solder caps 484a and 484b also depicted in FIG. 17. Well-known spin coating, baking masking and exposure development steps can be used to apply the mask 495 on the semiconductor chip 405a and fabricate the openings 497a and 497b therein.

Figure 22:
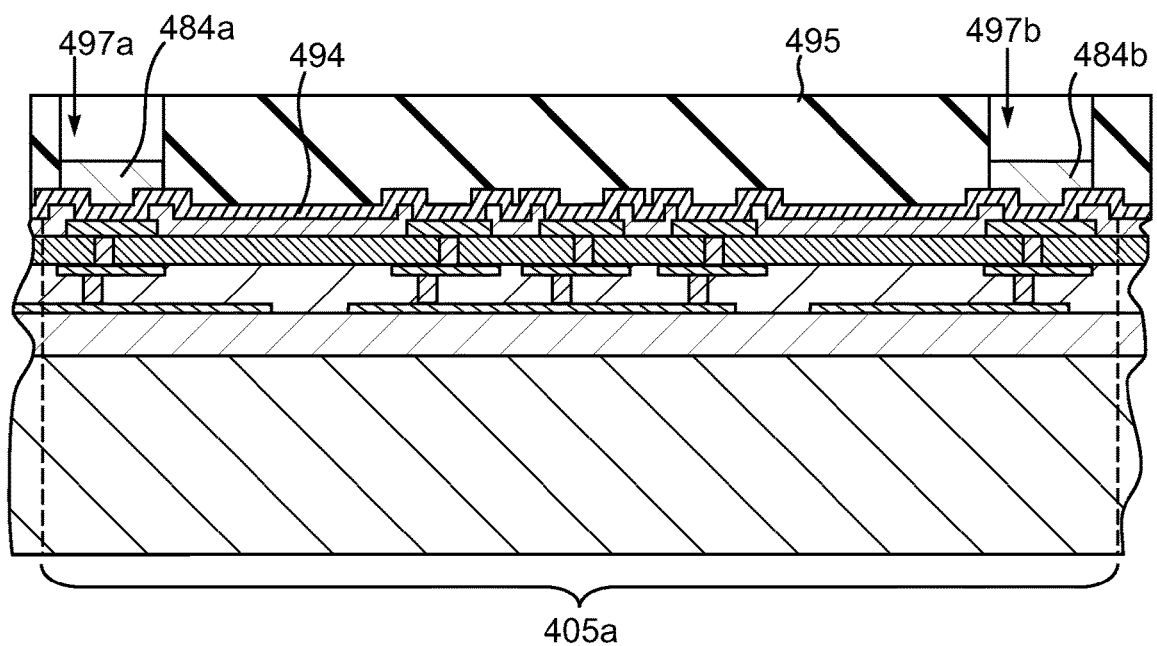
FIG. 22 is a sectional view like FIG. 21 but depicting exemplary fabrication of test pad solder caps.

Next and as shown in FIG. 22, the solder caps 484a and 484b are fabricated in the openings 497a and 497b using well-known plating techniques and the materials discussed above in conjunction with FIG. 6. The plating process can be a biased plating process that utilizes the seed layer 494 as a conductive layer to facilitate the electrical biasing during the plating process. Following fabrication of the solder caps 484a and 484b, the photoresist mask 495 depicted in FIGS. 21 and 22 is stripped using well-known ashing and solvent stripping techniques to expose the metallization seed layer 494 and the solder caps 484a and 484b as shown in FIG. 23.

Figure 23:
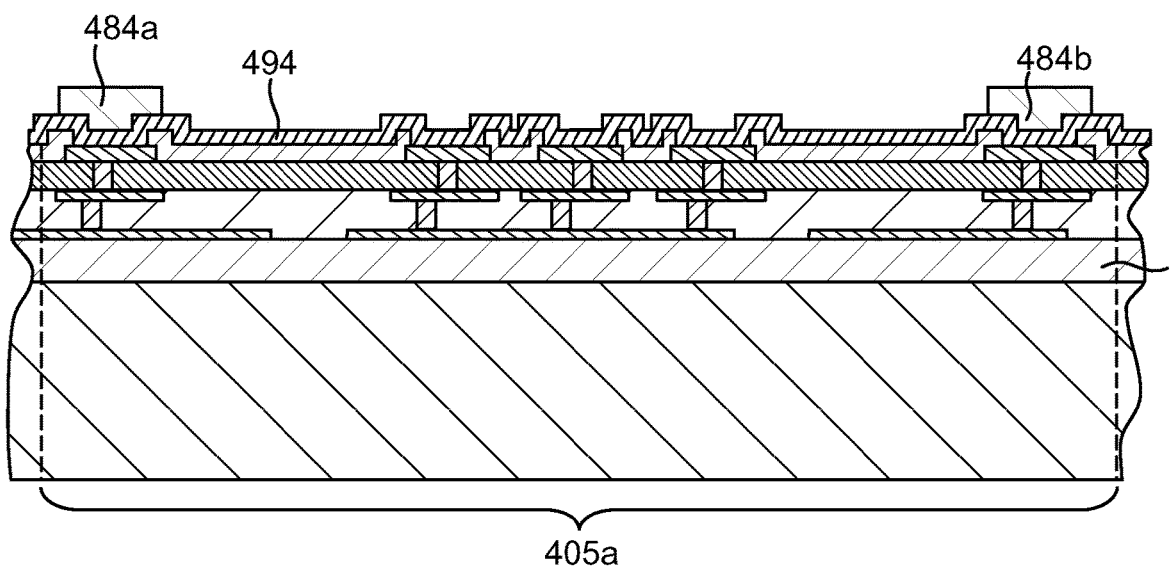
FIG. 23 is a sectional view like FIG. 22 but depicting additional processing.
Figure 24:
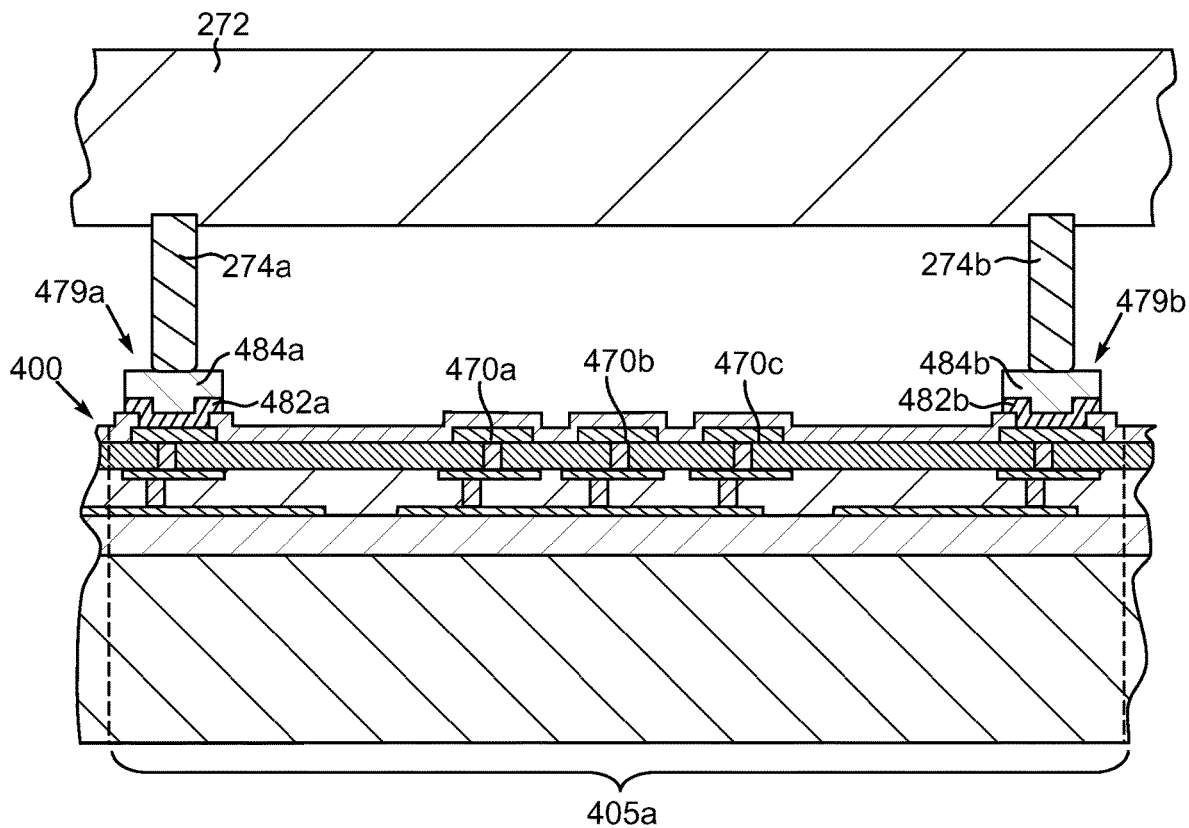
FIG. 24 is a sectional view like FIG. 23 but depicting exemplary probe testing of the solder cap test pads.

As shown in FIG. 24, an etch process is performed at this stage to remove the otherwise exposed portions of the metallization seed layer 494 shown in FIG. 23. This of course will remove the portions of the seed layer 494 that previously existed over the pads 470a, 470b and 470c, but the solder caps 484a and 484b act as etch masks such that the respective seed layers 482a and 482b remain in place. At this point, the semiconductor chip 405a can undergo probe testing by way of the probe card 272 and its probe pins 274a and 274b, which can be flat tipped at shown due to the usage of the solder caps 484a and 484b for the test pads 479a and 479b. Of course the etch process shown in FIG. 24 removes whatever seed layer material was previously available for the pads 470a, 470b and 470c and therefore additional metallization deposition steps will be required.

Figure 25:
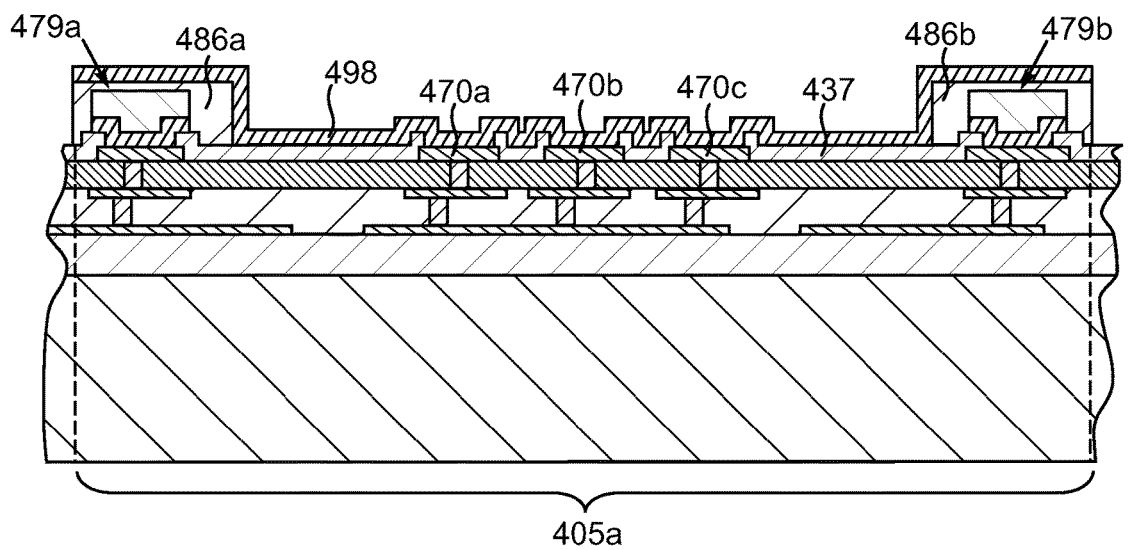
FIG. 25 is a sectional view like FIG. 24 but depicting exemplary polymer structure coating of the solder cap test pads.

Referring now to FIG. 25, a multitude of steps are performed as follows. Suitable openings are fabricated in the passivation layer 437 to expose portions of the underlying pads 470a, 470b and 470c. However, prior to forming the openings in the passivation layer 437, the polymer structures 486a and 486b are fabricated over the test pads 479a and 479b. The polymer structures 486a and 486b can be fabricated using a variety of techniques such as spin coating and baking. In one exemplary process, the polymer structures 486a and 486b can be constructed using the polymer materials discussed above with photoactive compounds and subsequent masking exposure and development in order to yield the individual polymer structures 486a and 486b. The polymer structures 486a and 486b could also be constructed by applying and subsequently masking and etching polymer material to yield the individual structures 486a and 486b.

Still referring to FIG. 25, following the fabrication of the polymer structures 486a 486b, the aforementioned openings leading to the pads 470a, 470b and 470c are fabricated and a metallization seed layer 498 is fabricated by well-known sputtering techniques as a blanket deposition. Of course portions are formed in ohmic contact with the underlying pads 470a, 470b and 470c.

Figure 26:
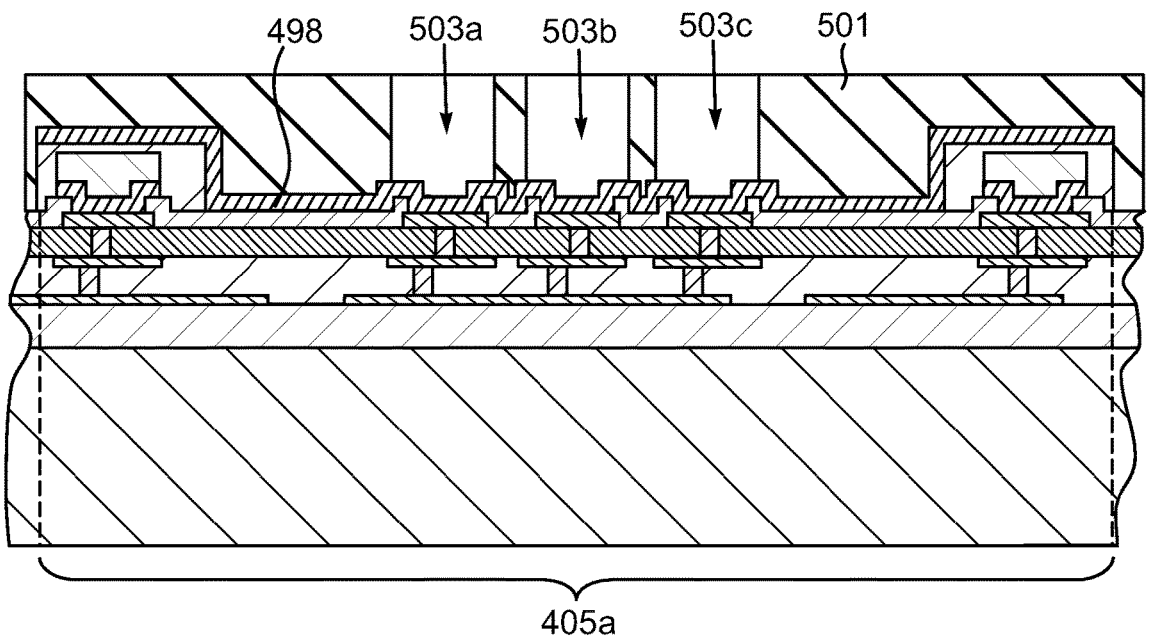
FIG. 26 is a sectional view like FIG. 25 but depicting additional processing.

The fabrication steps to complete the construction of the I/O structures 440a, 440b and 440c will now be described in conjunction with FIGS. 26, 27 and 28. Referring initially to FIG. 26, a photoresist mask 501 is fabricated on the plating seed layer 494 and over the solder caps 484a and 484b and patterned to establish suitable openings 503a, 503b and 503c at positions where the I/O structures 440a, 440b and 440c shown in FIG. 17 will be subsequently fabricated.

The same types of techniques described above for the fabrication and patterning of the photoresist mask 495 (see FIG. 22) can be used for the photoresist mask 501 as well.

Figure 27:
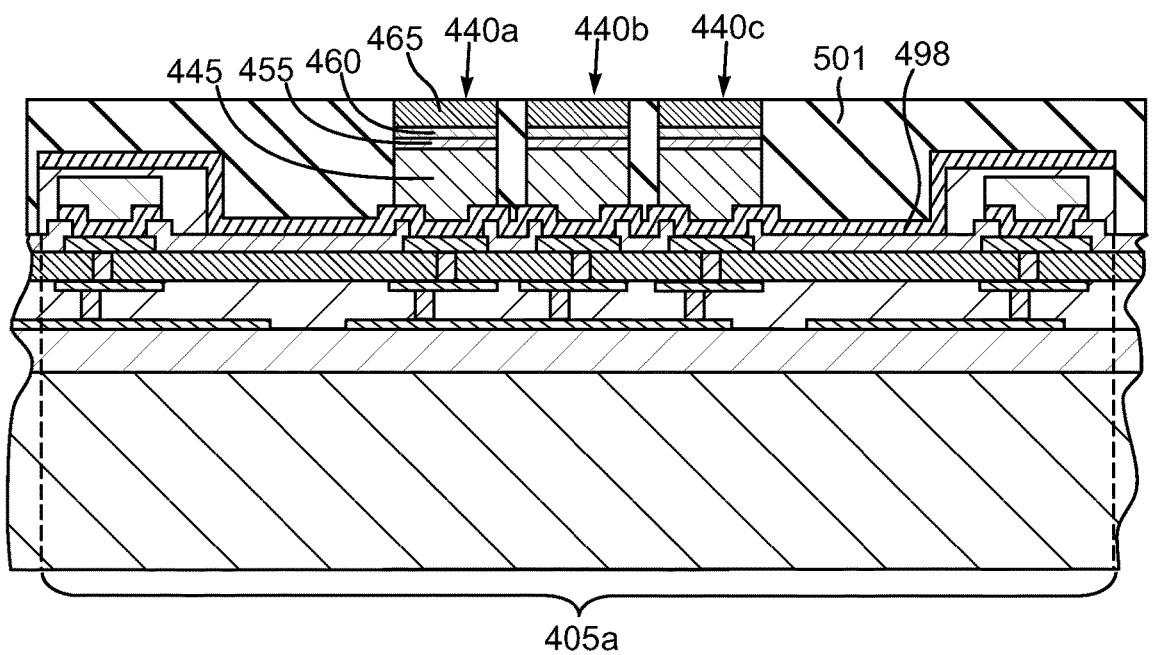
FIG. 27 is a sectional view like FIG. 26 but depicting exemplary I/O structure fabrication.
Figure 28:
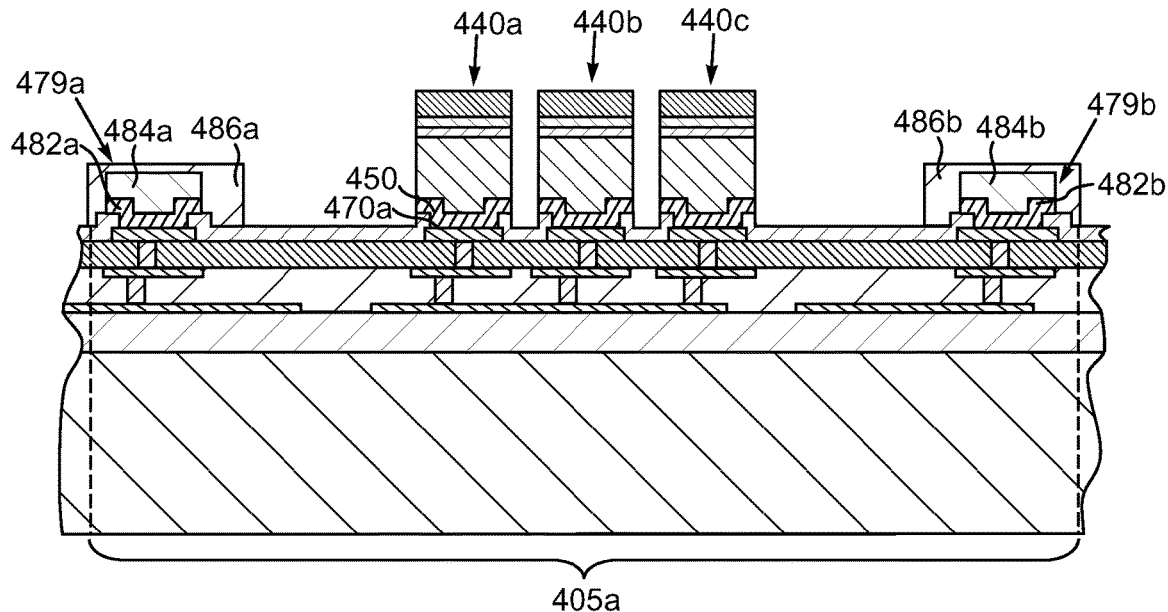
FIG. 28 is a sectional view like FIG. 27 but depicting additional processing.

Next and as shown in FIG. 27, a plurality of plating processes are performed to construct the I/O structures 440a, 440b and 440c with the photoresist mask 501 in position. The pillar portions 445 are constructed on the plating seed layer 498 using well-known plating processes, the barrier layers 455 are constructed using well-known plating processes to plate the barrier layers 455 on the pillar portions 445, the solderable layers 455 are fabricated on the barrier layers 455 using well-known plating processes and of course the solder caps 465 are fabricated on the solderable layers 460 using well-known plating processes. Following the various steps to fabricate the I/O structures 440a, 440b and 440c, the photoresist mask 501 shown in FIG. 27 is stripped as shown in FIG. 28 using well-known ashing and solvent stripping techniques to expose the I/O structures 440a, 440b and 440c and the test pads 479a and 479b which include the aforementioned solder caps 484a and 484b and the underlying seed layers 482a and 482b. Subsequent to the removal of the photoresist mask 501, an etch process is performed to remove exposed portions of the plating seed layer 498 shown in FIG. 27 to yield the seed layers 450 for the I/O structures 440a, 440b and 440c. The polymer structures 486a and 486b protect the solder caps 484a and 484b and the seed layers 482a and 482b from this etch. A reflow is performed at this stage to yield the semiconductor chip 405a in the state shown in FIG. 17.

Figure 29:
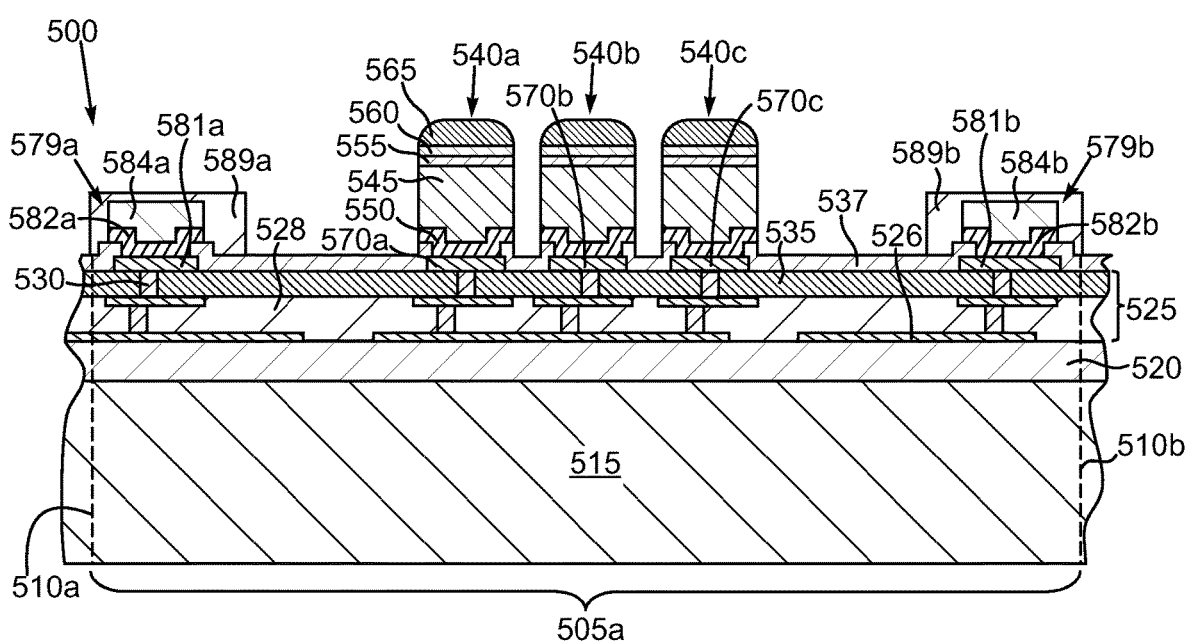
FIG. 29 is a sectional view depicting an alternate exemplary arrangement of a semiconductor chip that includes solder cap test pads.

In another exemplary arrangement that provides for pre-I/O structure reflow electrical testing, a photoresist layer is used in lieu of the aforementioned polymer structures 486a and 486b depicted in FIG. 17. This alternative arrangement can be understood by referring now to FIGS. 29, 30, 31, 32, 33, 34 and 35. FIG. 29 depicts a sectional view like FIG. 17. Here, a semiconductor wafer 500 can include multitudes of semiconductor chips, one of which is shown and labeled 505a. The semiconductor chip 505a is delineated laterally by dashed lines 510a and 510b respectively. The semiconductor wafer 500 includes scores of such chips 505a. The semiconductor chip 505a can be substantially identical to the semiconductor chip 405a described above with a few notable exceptions. Accordingly, the semiconductor chip 505a includes a base substrate 515, which can be composed of silicon, germanium, semiconductor on insulator such as silicon on sapphire or other types of semiconductor substrate materials. A device region 520 is fabricated on the substrate 515 and includes large numbers of circuit elements, such as transistors, capacitors, resistors, and others that make up multitudes of logic elements etc. A metallization stack 525 is fabricated on the device region 520 and includes plural metallization layers and interlevel dielectric layers. The metallization layers can include conductor traces 526 interconnected by conductive vias 530. One exemplary interlevel dielectric layer is shown and labeled 528. A passivation layer 535 is fabricated as part of the metallization stack 525 and can be composed of various well-known passivation materials such as SiOx, silicon nitride, silicon oxynitride, or even polymer materials, such as polyimide or benzocyclobutene.

To electrically interface with another structure, such as a circuit board (not shown), the semiconductor chip 505a is fabricated with plural I/O structures 540a, 540b and 540c, respectively. The skilled artisan will appreciate that there may be scores, hundreds or even thousands of such I/O structures 540a, 540b and 540c. The I/O structures 540a, 540b and 540c are operable to convey power, ground and/or signals. In this illustrative arrangement, the I/O structures 540a, 540b and 540c are microbumps. However, solder bumps, conductive pillars or other types of I/O structures could be used. Each of the I/O structures 540a, 540b and 540c consists of a pillar portion 545 fabricated on a seed layer 550 and topped by a barrier layer 555 formed on the pillar portion 545, a solderable layer 560 formed on the barrier layer 555 and a solder cap 565 formed on the solderable layer 560. The seed layer 550 is fabricated on and in electrical contact with an underlying bump pad 570a and the/O structures 540b and 540c are similarly fabricated on bump pads 570b and 570c. The seed layer 550 can be composed of copper, titanium, or other like materials that facilitate subsequent plating, and can be applied using well-known sputtering techniques. The pillar portion 545 can be composed of copper, aluminum, gold, silver, platinum, palladium, alloys of these or the like, and be applied using well-known plating techniques. The barrier layer 555 is designed to prevent diffusion of materials into or out of the solder cap 565. The barrier layer 555 can be composed of nickel, vanadium or the like and applied using well-known plating techniques. The solderable layer 560 serves as a layer that exhibits better wetting and bonding to solder than the barrier layer 555. The solderable layer 560 can be composed of the same types of materials as the pillar portion 545 and applied using well-known plating techniques. The solder cap 565 can be composed of tin-silver, tin-silver-copper or like lead-free solders and can be applied by well-known stencil, plating or pick and place techniques.

The I/O structures 540a, 540b and 540c are fabricated on respective bump pads 570a, 570b and 570c. The bump pads 570a, 570b and 570c are part of an uppermost metallization layer of the stack 525 and can be composed of copper, aluminum, gold, silver, platinum, palladium, alloys of these or the like, and be applied using well-known sputtering and etching or plating techniques. Like the semiconductor chip 205a depicted in FIG. 6 and described above, it is desirable to electrically probe the semiconductor chip 505a using the probe card 272 that has multitudes of probe pins 274a and 274b. However, and for the same reasons discussed earlier, it is impractical to directly probe the I/O structures 540a, 540b and 540c with the probe pins 274a and 274b shown in FIG. 6. This is primarily due to the fact that the I/O structures 540a, 540b and 540c have a spacing or pitch and size that are too fine for typical probe cards. Accordingly, the semiconductor chip 505a is manufactured with solder-based probe pads 579a and 579b and plural additional such probe pads that are not visible in FIG. 29. The probe pad 579a consists of an underlying conductor pad 581a, a seed layer 582a and a solder cap 584a. The probe pad 579b is similarly constructed with a conductor pad 581b, a seed layer 582b and a solder cap 584b. The conductor pads 581a and 581b can be constructed of the same materials as the pads 570a, 570b and 570c. The seed layers 582a and 582b can be constructed of the same materials as the seed layers 550 discussed above. The solder caps 584a and 584b can be constructed of the same types of solders as the solder caps 565 discussed above. The usage of probe pads 579a and 579b with solder caps 584a and 584b, respectively, has the several advantages discussed above for the semiconductor chips 205a and 405a.

The arrangement of the semiconductor chip 505a is substantially the same as the semiconductor chip 405a. The arrangement of the semiconductor chip 505a differs from the semiconductor chip 405a principally in that the solder caps 584a and 584b are covered with respective photoresist structures 589a and 589b and not the polymer structures 486a and 486b shown in FIG. 17. As in the FIG. 17 arrangement, the solder caps 584a and 584b have not yet been subjected to reflow but have been utilized to electrically probe test the semiconductor chip 505a prior to the reflow process to liquify the solder caps 565 of the I/O structures 540a, 540b and 540c. The photoresist structures 589a and 589b can be constructed of well-known positive tone or negative tone photoresist materials and photolithography techniques.

Figure 30:
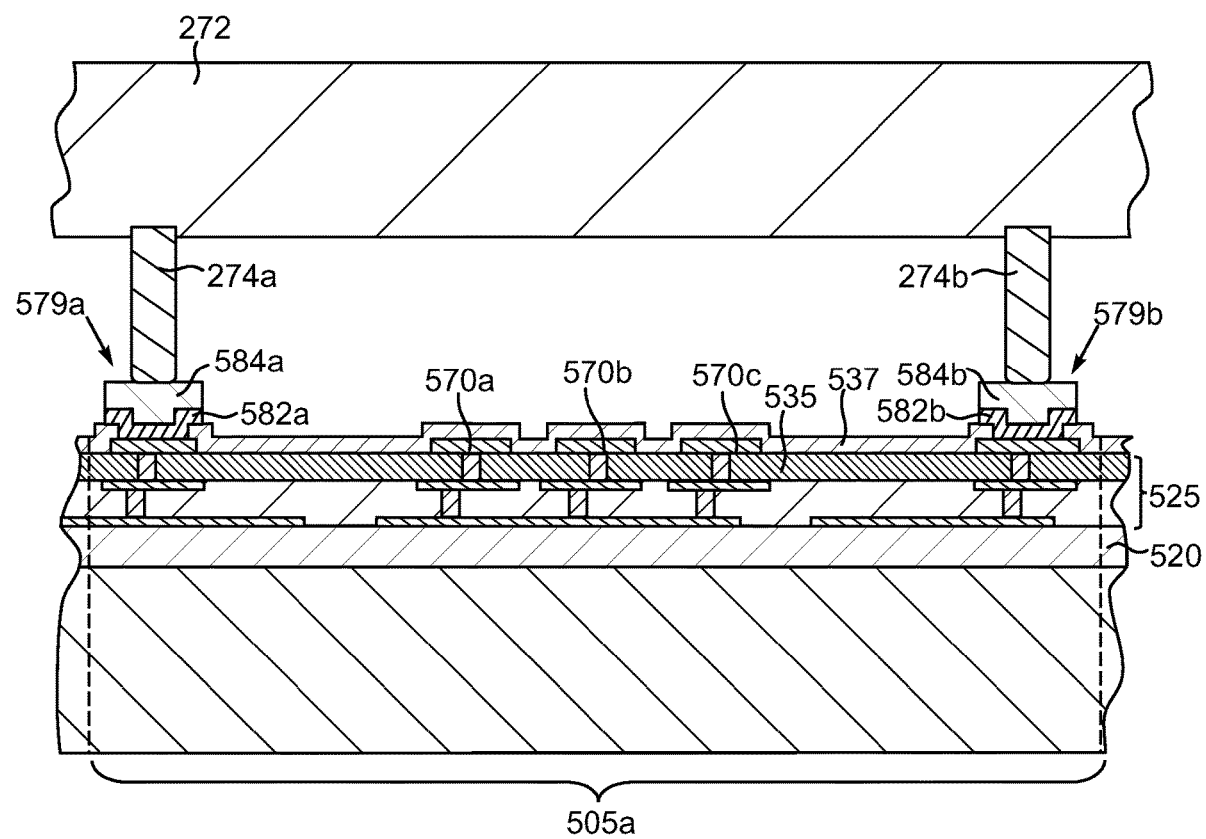
FIG. 30 is a sectional view depicting initial processing of the semiconductor chip and probe testing of the solder cap test pads.
Figure 31:
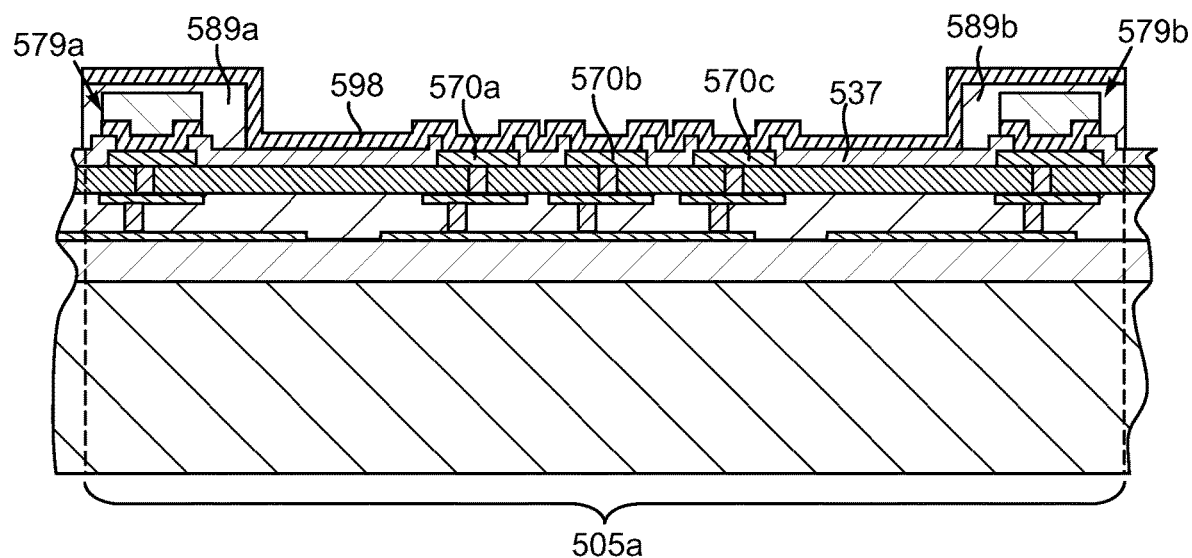
FIG. 31 is a sectional view like FIG. 30 but depicting additional processing including the fabrication of photoresist mask structures over the solder cap test pads.

An exemplary process for fabricating the semiconductor chip 505a can be understood by referring now to FIGS. 30 to 35, and initially to FIG. 30. As shown in FIG. 30, the semiconductor chip 505a has undergone the same processing steps described above in conjunction with the semiconductor chip 405a and FIGS. 18, 19, 20, 21, 22 and 23. Accordingly, device region 520, the metallization stack 525, the passivation layers 535 and 537, the bump pads 570a, 570b and 570c, the solder probe pads 579a and 579b with their respective seed layers 582a and 582b, and solder caps 584a and 584b have been constructed in the same way as those corresponding structures in the semiconductor chip 405a discussed above. At the point depicted in FIG. 30, the semiconductor chip 505a can undergo electrical probe testing by way of the probe card 272 and its respective probe pins 274a and 274b, which can be flat tipped as shown in light of the fact that the solder caps 584a and 584b are used for the pads 579a and 579b. Following this intermediary electrical testing depicted in FIG. 30, the semiconductor chip 505a can undergo additional processing to fabricate the I/O structures to be subsequently depicted. Thus and as shown in FIG. 31, photoresist mask structures 589a and 589b are fabricated over the test pads 579a and 579b. This fabrication of the photoresist mask structures 589a and 589b can be performed using well-known photoresist application, baking, exposure and development steps. Next, a seed layer 598 is fabricated over the passivation layer 537 after suitable openings in the passivation layer 537 are fabricated using the techniques described above to expose portions of the underlying pads 570a, 570b and 570c.

Figure 32:
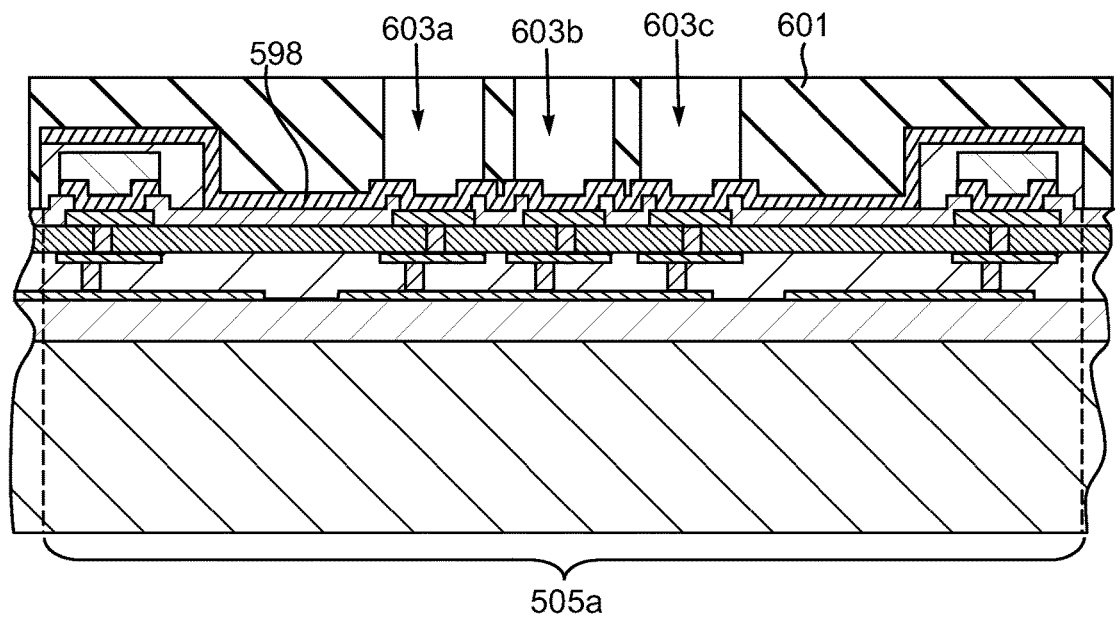
FIG. 32 is a sectional view like FIG. 31 depicting additional processing.

Next and as shown in FIG. 32, a photoresist mask 601 is fabricated on the metallization seed layer 598 of the semiconductor chip 505a and patterned to establish suitable openings 603a, 603b and 603c at positions where the I/O structures 540a, 540b and 540c shown in FIG. 29 will be subsequently fabricated. The same types of techniques described above for the fabrication and patterning of the photoresist mask 501 can be used for the photoresist mask 601 as well.

Figure 33:
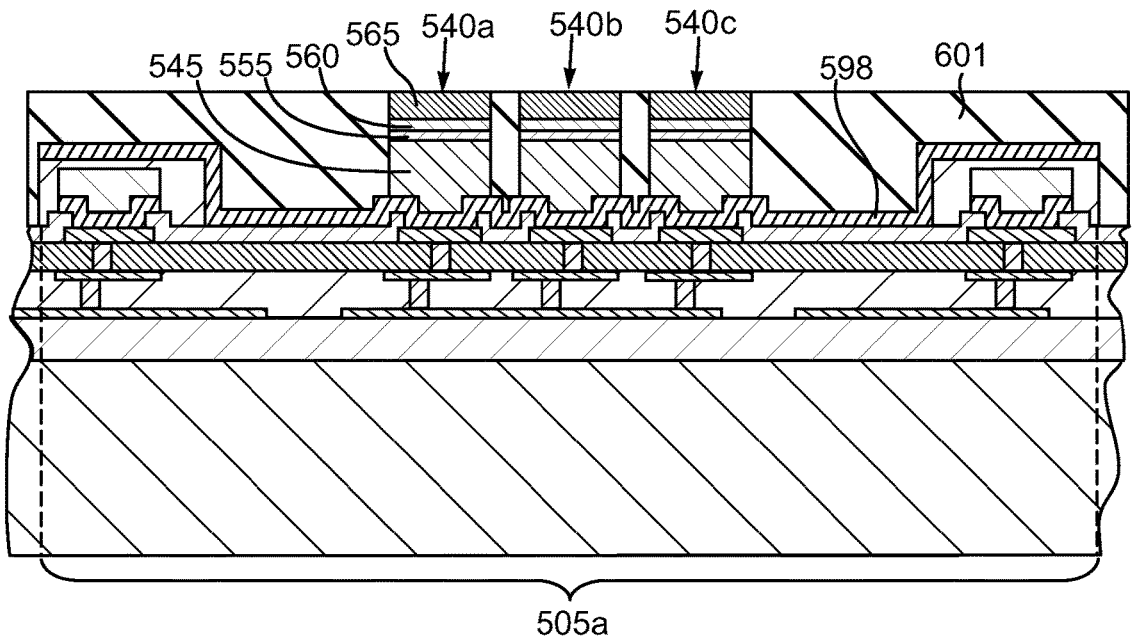
FIG. 33 is a sectional view like FIG. 32 depicting the exemplary fabrication of I/O structures.
Figure 34:
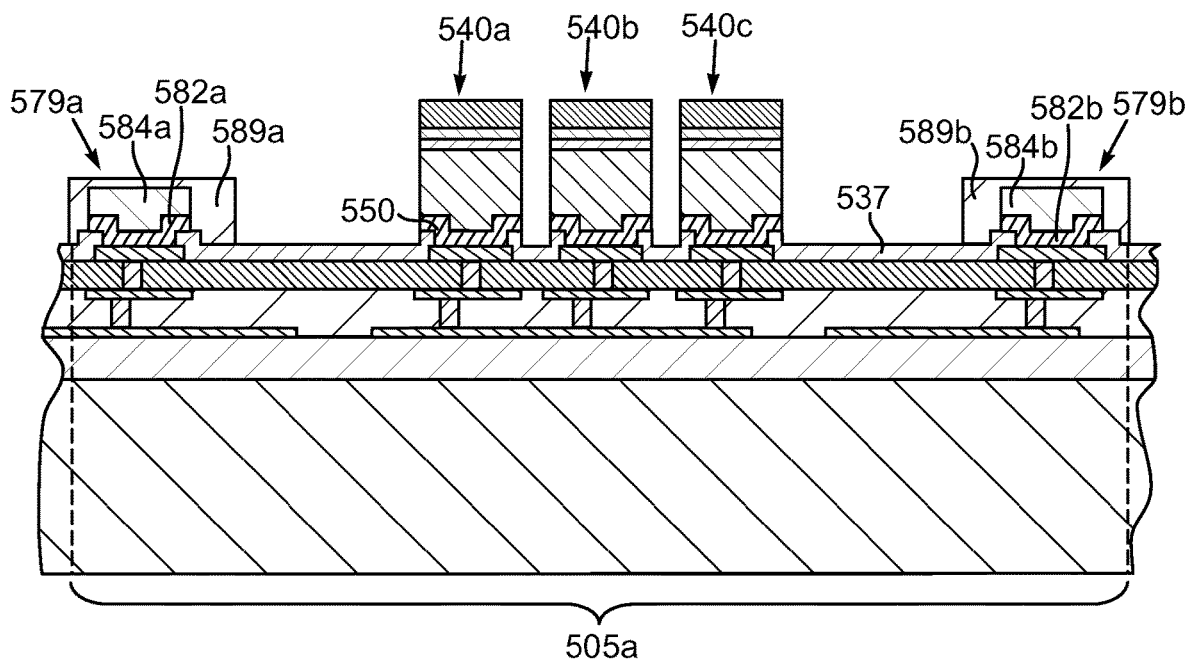
FIG. 34 is a sectional view like FIG. 33 but depicting additional processing.

Next and as shown in FIG. 33, a plurality of plating processes are performed on the semiconductor chip 505a to construct the I/O structures 540a, 540b and 540c with the photoresist mask 601 in position. The pillar portions 545 are constructed using well-known plating processes, the barrier layers 555 are constructed using well-known plating processes to plate the barrier layers 555 on the pillar portions 545, the solderable layers 560 are fabricated on the barrier layers 555 using well-known plating processes and of course the solder caps 565 are fabricated on the solderable layers 555 using well-known plating processes. Following the various steps to fabricate the I/O structures 540a, 540b and 540c, the photoresist mask 601 is stripped as shown in FIG. 34 using well-known ashing and solvent stripping techniques to expose the I/O structures 540a, 540b and 540c and the test pads 579a and 579b, which include the aforementioned solder caps 584a and 584b and the underlying seed layers 582a and 582b. Indeed, subsequently the removal of the mask 601, an etch process is performed to remove exposed portions of the metallization seed layer 598 shown in FIG. 33 to yield each of the seed layers 550 for the I/O structures 540a, 540b and 540c as shown in FIG. 34. The photoresist mask structures 589a and 589b protect the solder probe pads 579a and 579b during this etch process.

Figure 35:
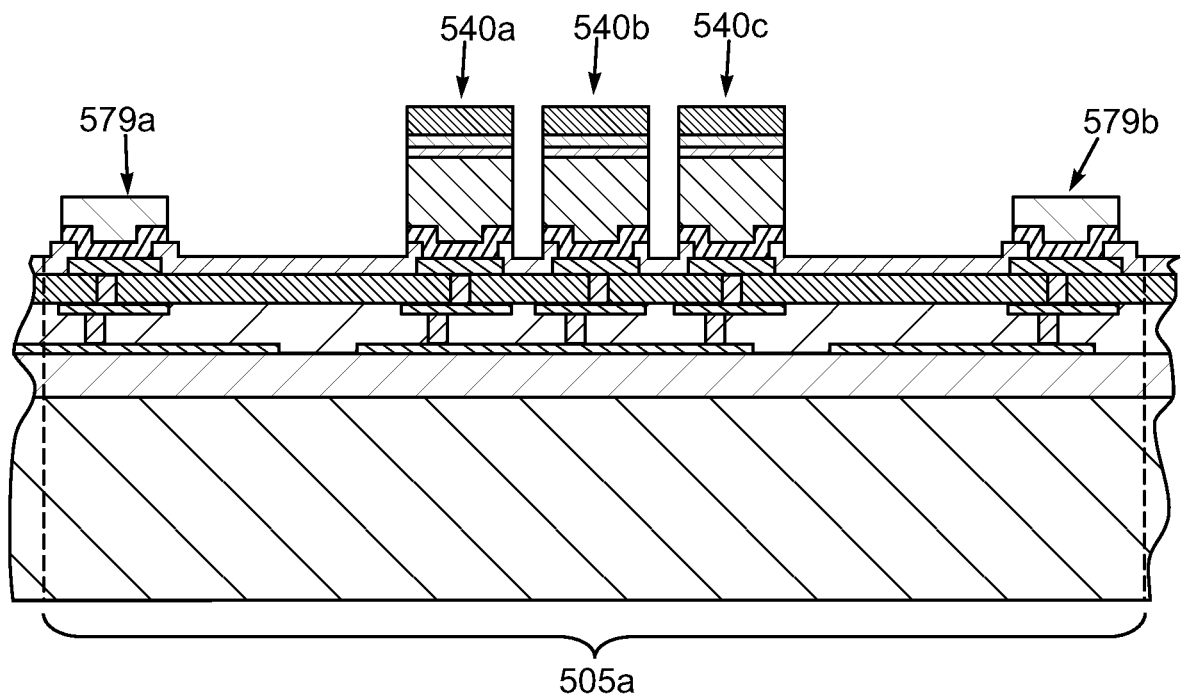
FIG. 35 is a sectional view like FIG. 34 but depicting additional processing.

Next and as shown in FIG. 35, the photoresist mask structures 589a and 589b are stripped from the semiconductor chip 505a using well-known ashing and solvent stripping techniques to expose the solder test pads 579a and 579b. Following this mask strip, a suitable reflow can be performed to yield the structure shown in FIG. 29 since the aforementioned photoresist mask structures 589a and 589b have been removed. It should be understood that probe testing can be conducted pre or post reflow.

Figure 36:
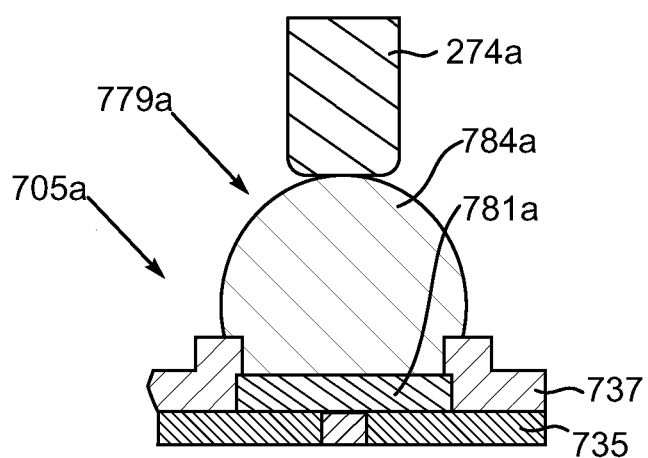
FIG. 36 is a sectional view depicting a small portion of an alternate exemplary semiconductor chip that incorporates solder cap test pads without plating seed layers.

In the arrangements of the semiconductor chips 205a, 405a and 505a described above and shown in earlier figures, a plating process is typically used in order to establish seed layers beneath the solder caps of each of the solder cap test pads. However, it should be understood that solder cap test pads can be constructed using other than plating processes and thus obviate the need for plating seed layers. In this regard, attention is now turned to FIG. 36, which is a sectional view of an alternate exemplary solder cap test pad 779a fabricated on an alternate exemplary semiconductor chip 705a. Here, FIG. 36 depicts a small portion of the semiconductor chip 705a including an exemplary conductor pad 781a, the small portions of two passivation layers 735 and 737 which can be identical to the passivation layers 235 and 237 described above. Here, there is no plating seed layer since the solder cap 784a is placed or otherwise fabricated using other than plating processes. For example, the solder cap 784a can be placed on the conductor pad 781a by pick and place operations or even stencil processes and a subsequent reflow performed in order to establish metallurgical bonding between the solder cap 784a and the underlying pad 781a. The solder cap 784a can be probed using the probe pins 274a as described above in the same way and to achieve the same beneficial results of using a solder cap test pad, namely the facilitation of a flat ended probe pin 274a and the lighter impact loading required in order to contact the solder cap 784a.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip, comprising:
a substrate;
plural input/output (I/O) structures on the substrate;
plural test pads on the substrate, each of the test pads including a first conductor pad and a first solder cap on the first conductor pad, wherein the first solder cap is configured, without reflow, to receive a test probe; and
a polymer structure positioned over the first solder cap without reflow.

2. The semiconductor chip of claim 1, wherein each of the test pads includes a plating seed layer between the first solder cap and the first conductor pad.

3. The semiconductor chip of claim 1, wherein the I/O structures comprise microbumps.

4. The semiconductor chip of claim 3, wherein each of the microbumps comprises a pillar portion, a barrier layer on the pillar portion, a solderable layer on the barrier layer and a second solder cap on the solderable layer.

5. The semiconductor chip of claim 4, wherein the semiconductor chip includes plural second conductor pads, each of the microbumps includes a plating seed layer positioned between one of the second conductor pads and the pillar portion.

6. The semiconductor chip of claim 1, wherein the polymer structure is infused with photoactive compounds and formed using photolithography.

7. The semiconductor chip of claim 1, comprising a photoresist mask structure positioned over each of the test pads.

8. A method of manufacturing a semiconductor chip having a substrate, comprising:
fabricating plural input/output (I/O) structures on the substrate;
fabricating plural test pads on the substrate, each of the test pads including a first conductor pad and a first solder cap on the first conductor pad, wherein the first solder cap is configured, without reflow, to receive a test probe; and
fabricating a polymer structure over the first solder cap without reflow.

9. The method of claim 8, comprising fabricating a plating seed layer between the first solder cap and the first conductor pad of each of the test pads.

10. The method of claim 8, wherein the I/O structures comprise microbumps.

11. The method of claim 10, wherein each of the microbumps comprises a pillar portion, a barrier layer on the pillar portion, a solderable layer on the barrier layer and a second solder cap on the solderable layer.

12. The method of claim 11, comprising fabricating plural second conductor pads on the substrate and a plating seed layer on each of the conductor pads and one of the pillar portions on each of the plating seed layers.

13. The method of claim 8, wherein the polymer structure is infused with photoactive compounds and formed using photolithography.

14. The method of claim 8, comprising fabricating a photoresist mask structure over each of the test pads.

15. A method of testing a semiconductor chip, the semiconductor chip having a substrate, plural first conductor pads on the substrate and plural test pads on the substrate each including a second conductor pad and a first solder cap on the second conductor pad, the method comprising:
without reflow, contacting one or more probe pins on one or more of the first solder caps;
probe testing the semiconductor chip; and
fabricating a polymer structure over the one or more first solder caps without reflow.

16. The method of claim 15, wherein the one or more probe pins have a flat end to contact the one or more first solder caps.

17. The method of claim 15, wherein the polymer structure is infused with photoactive compounds and formed using photolithography after probe testing.

18. The method of claim 15, comprising fabricating a photoresist mask structure over each of the test pads after probe testing.

19. The method of claim 15, wherein the semiconductor chip comprises part of a semiconductor wafer.

20. The method of claim 15, comprising fabricating plural input/output structures on each of the first conductor pads after probe testing.

* * * * *